United States Patent
Shiino et al.

(10) Patent No.: US 8,737,134 B2
(45) Date of Patent: May 27, 2014

(54) NONVOLATILE SEMICONDUCTOR STORAGE DEVICE

(75) Inventors: Yasuhiro Shiino, Yokohama (JP); Eietsu Takahashi, Yokohama (JP); Yuji Takeuchi, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 110 days.

(21) Appl. No.: 13/417,719

(22) Filed: Mar. 12, 2012

(65) Prior Publication Data

US 2013/0058170 A1    Mar. 7, 2013

(30) Foreign Application Priority Data

Sep. 2, 2011 (JP) ................................. 2011-192085

(51) Int. Cl.
*G11C 11/34* (2006.01)
(52) U.S. Cl.
USPC ............... 365/185.2; 365/185.29; 365/185.23
(58) Field of Classification Search
USPC .............................. 365/185.2, 185.29, 185.23
See application file for complete search history.

(56) References Cited

U.S. PATENT DOCUMENTS

| 7,630,251 | B2 * | 12/2009 | Hosono ....................... 365/185.2 |
| 7,916,548 | B2 | 3/2011 | Futatsuyama |
| 7,995,392 | B2 | 8/2011 | Shibata |
| 8,023,327 | B2 | 9/2011 | Futatsuyama |
| 2011/0063917 | A1 | 3/2011 | Shiino et al. |
| 2011/0228608 | A1 | 9/2011 | Shiino et al. |

FOREIGN PATENT DOCUMENTS

JP        2009-252278       10/2009

OTHER PUBLICATIONS

Office Action issued on Mar. 26, 2013 in the corresponding Japanese Patent Application No. 2011-192085 (with English Translation).
U.S. Appl. No. 13/227,050, filed Sep. 7, 2011, Yasuhiro Shiino, et al.

* cited by examiner

*Primary Examiner* — Son Dinh
*Assistant Examiner* — Nam Nguyen
(74) *Attorney, Agent, or Firm* — Oblon, Spivak, McClelland, Maier & Neustadt, L.L.P.

(57) ABSTRACT

A nonvolatile semiconductor storage device according to an embodiment includes a drive circuit. A voltage applied to a dummy wire connected to a first dummy cell adjacent to a memory string is defined as a first dummy wire voltage, a voltage applied to a selection wire connected to a first memory cell adjacent to the first dummy cell is defined as a first selection wire voltage, and a voltage applied to a selection wire connected to a second memory cell adjacent to the first memory cell is defined as a second selection wire voltage. When the second selection wire voltage is lower than the first dummy wire voltage in an erase operation, the drive circuit controls voltages so that a difference between the first dummy wire voltage and the second selection wire voltage is less than a difference between the first dummy wire voltage and the first selection wire voltage.

18 Claims, 20 Drawing Sheets

A: TWO-VALUE DATA STORAGE

B: FOUR-VALUE DATA STORAGE

NONVOLATILE SEMICONDUCTOR STORAGE DEVICE

CROSS-REFERENCE TO RELATED APPLICATIONS

This application is based upon and claims the benefit of priority from the prior Japanese Patent Application No. 2011-192085, filed on Sep. 2, 2011, the entire contents of which are incorporated herein by reference.

FIELD

Embodiments described herein relate to a nonvolatile semiconductor storage device.

BACKGROUND

A NAND-type flash memory is known as an electrically rewritable nonvolatile semiconductor storage device capable of achieving high density integration.

A memory cell of a NAND-type flash memory includes at least one of a charge storage layer formed on a semiconductor substrate with a tunnel insulating film interposed therebetween and a control gate laminated thereon with an inter gate insulating film interposed therebetween, and the memory cell stores data with charge storage state of the charge storage layer in a nonvolatile manner.

In recent years, the NAND-type flash memory involves various problems along with progress in the reduction of size of the memory cell array.

For example, one of such problems includes the following issue. During erase verification operation in an erase sequence, a threshold voltage of a memory cell appears to be different from an actual threshold voltage due to inter-cell interference effect.

DETAILED DESCRIPTION

A nonvolatile semiconductor storage device according to an embodiment comprises a cell array including a cell unit, a selection wire and a dummy wire, the cell unit including a memory string in which a plurality of memory cells for storing data are connected in series and one or more dummy cells being provided at one end of the memory string, the selection wire connecting to each of the memory cells, and the dummy wire connecting to each of the dummy cells; and a drive circuit applying voltages to the selection wire and the dummy wire during erase operation for erasing data in the memory cells. The dummy cell adjacent to the memory string is defined as a first dummy cell, the memory cell adjacent to the first dummy cell is defined as a first memory cell, the memory cell adjacent to the first memory cell is defined as a second memory cell, a voltage applied to the dummy wire connected to the first dummy cell is defined as a first dummy wire voltage, a voltage applied to the selection wire connected to the first memory cell is defined as a first selection wire voltage, and a voltage applied to the selection wire connected to the second memory cell is defined as a second selection wire voltage. When the second selection wire voltage is lower than the first dummy wire voltage in the erase operation, the drive circuit controlling the voltages so that a difference between the first dummy wire voltage and the second selection wire voltage is less than a difference between the first dummy wire voltage and the first selection wire voltage.

A nonvolatile semiconductor storage device according to embodiments will be hereinafter explained with reference to drawings.

[First Embodiment]

<Configuration of Nonvolatile Semiconductor Storage Device>

First, the entire configuration of a NAND-type flash memory, i.e., a nonvolatile semiconductor storage device according to the first embodiment, will be explained.

Figure 1:
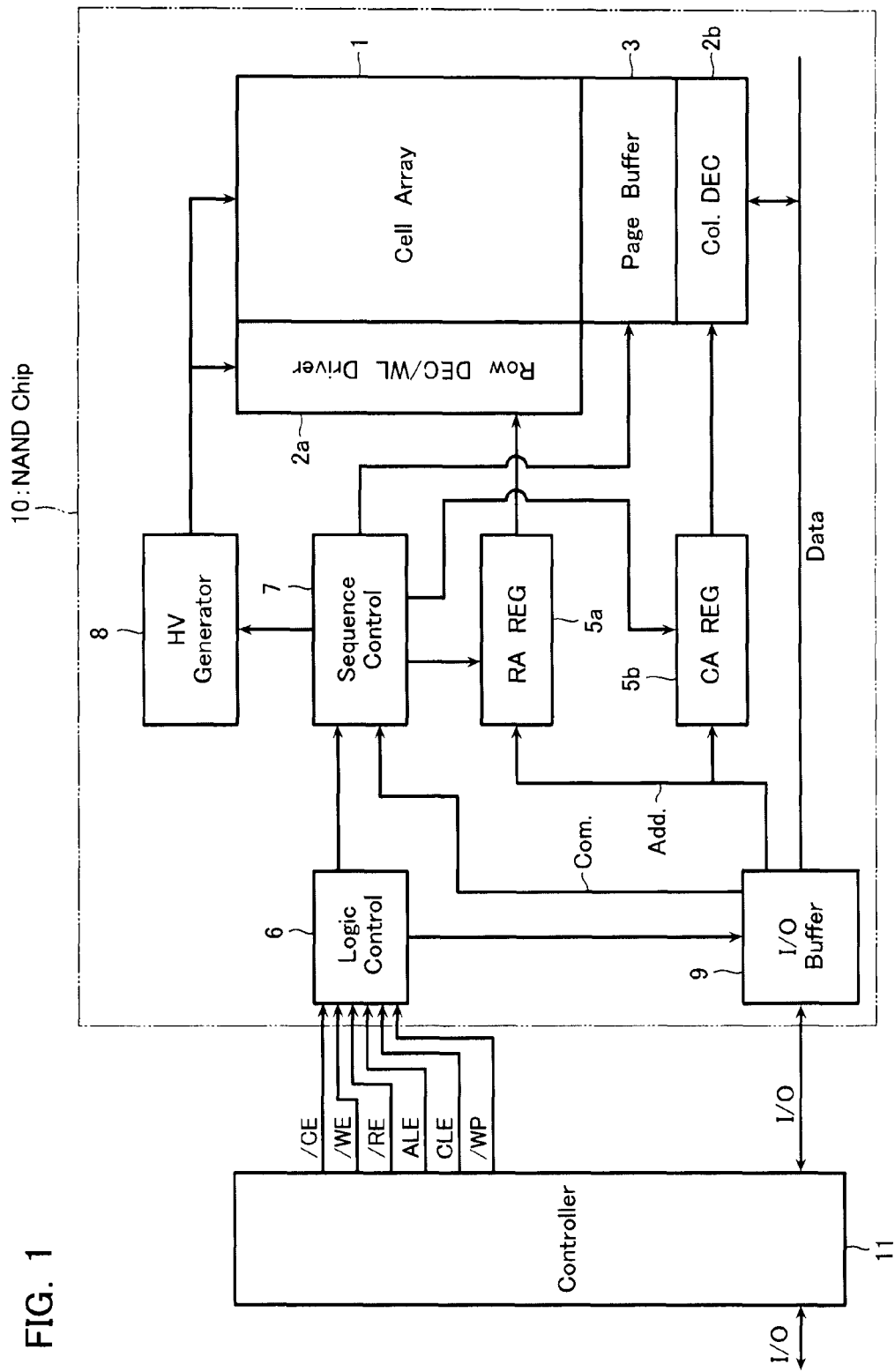
FIG. 1 is a block diagram illustrating a nonvolatile semiconductor storage device according to a first embodiment.

FIG. 1 is a block diagram illustrating the configuration of the NAND-type flash memory according to the present embodiment.

The NAND-type flash memory includes a NAND chip 10 and a controller 11 for controlling the NAND chip 10.

The NAND chip 10 includes a cell array 1, a row decoder/word line driver 2a and a column decoder 2b, a page buffer 3, a row address register 5a and a column address register 5b, a logic control circuit 6, a sequence control circuit 7, a high voltage generation circuit 8, and an I/O buffer 9.

The cell array 1 includes bit lines, word lines (selection wires), selection gate lines (gate wires), and one of plurality of memory cells selected by the bit line, the word line, and the selection gate line. The cell is constituted by a transistor having at least one of a charge storage layer such as a floating gate and an insulating film with charge trap.

The row decoder/word line driver 2a drives the word line and the selection gate line of the cell array 1. The page buffer 3 has a sense amplifier and a data holding circuit for one page, and reads/writes data of the cell array 1 in units of pages.

Columns of read data for one page of the page buffer 3 are successively selected by the column decoder 2b, and the data are output via an I/O buffer 9 to an external I/O terminal.

Each page of the write data supplied from the I/O terminal is selected by the column decoder 2b, and is loaded to the page buffer 3.

A row address signal and a column address signal are input via the I/O buffer 9, and are transferred to the row decoder/word line driver 2a and the column decoder 2b, respectively. The row address register 5a holds an erase block address during erase sequence, and a page address is held in a write sequence and a read sequence. A head column address required for loading write data before start of write sequence and a head column address required for read sequence are input to the column address register 5b. The column address register 5b holds the input column address until a write enable signal /WE and a read enable signal /RE are toggled with a predetermined condition.

The logic control circuit 6 controls input of commands and addresses and input/output of data on the basis of control signals such as a chip enable signal /CE, a command enable signal CLE, an address latch enable signal ALE, the write enable signal /WE, and the read enable signal /RE. The sequence control circuit 7 receives a command from the logic control circuit 6, and controls the erase sequence, the read sequence, and the write sequence. That is, the sequence control circuit 7 controls the row address register 5a, the column address register 5b, the row decoder/word line driver 2a, and the like, thereby controlling the erase sequence, the read sequence, and the write sequence.

The high voltage generation circuit 8 is controlled by the sequence control circuit 7, and generates a predetermined voltage required for various kinds of operations.

The controller 11 executes control of read/write of data under a condition suitable for the current write state of the NAND chip 10.

Subsequently, an example of configuration of the cell array 1 will be explained with reference to FIG. 2.

Figure 2:
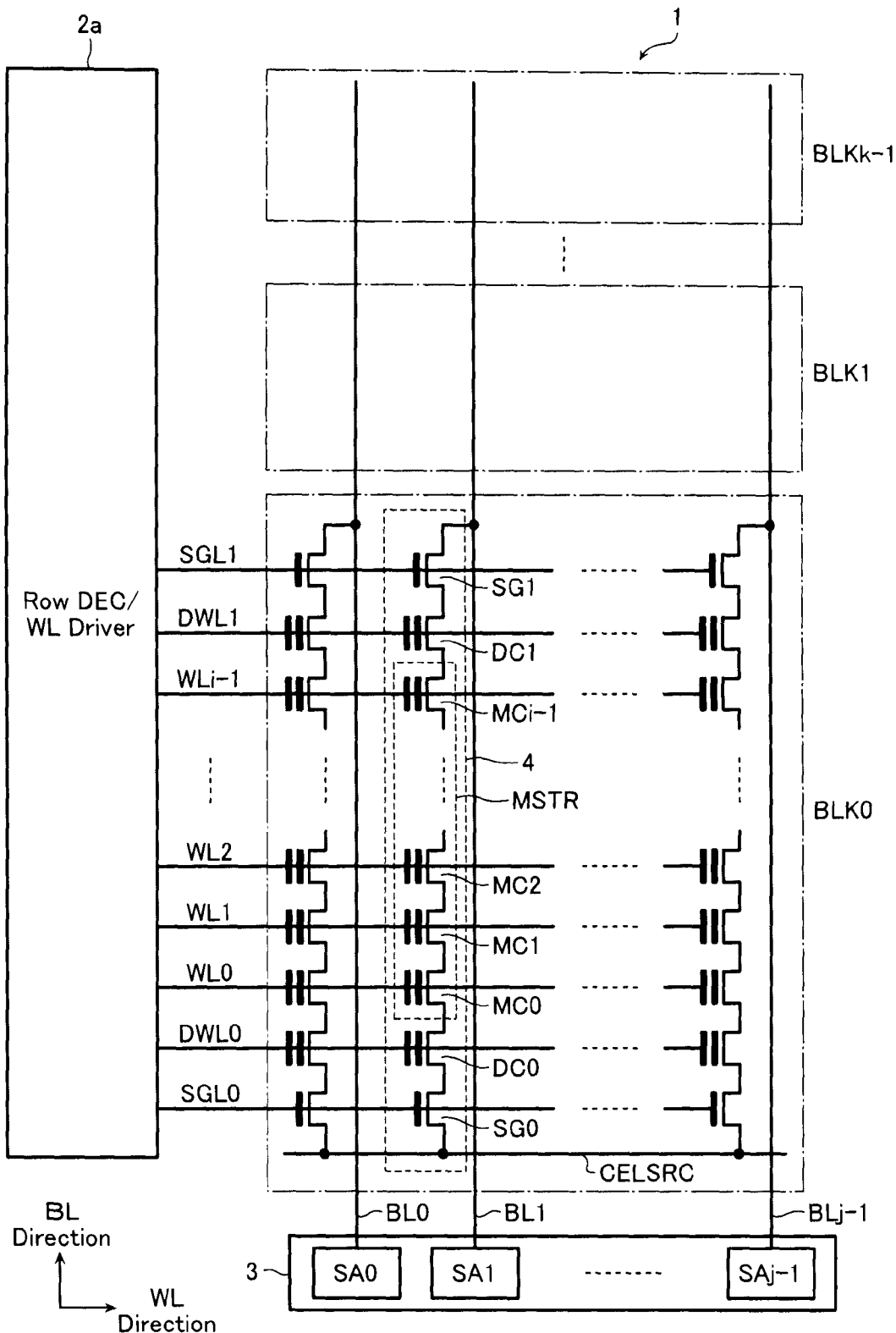
FIG. 2 is a circuit diagram illustrating a cell array of a nonvolatile semiconductor storage device according to the embodiment.

In the cell array 1 as shown in FIG. 2, the NAND cell unit 4 is constituted by a memory strings MSTR including i memory cells MC0 to MCi−1 connected in series, i.e., cells used for storing data, and selection gate transistors SG0 and SG1 connected to both ends thereof. A source of the selection gate transistor SG0 is connected to the common source line CELSRC, and a drain of the selection gate transistor SG1 is connected to the bit line BL (BL0 to BLj−1). The control gates of the memory cell MC0 to MCi−1 are respectively connected to the word lines WL (WL0 to WLi−1), and the gates of the selection gate transistors SG0 and SG1 are respectively connected to the selection gate lines SGS and SGD.

As shown in FIG. 2, as necessary, dummy word lines DWL0 and DWL1 (dummy wires) which have similar structure as word lines WL and dummy cells DC0 and DC1 which have similar structure as memory cells MC may be provided between the memory strings MSTR and the selection transistors SG0 and SG1. In this case, the influence of the gate induction drain leak current caused by the selection gate transistors SG0 and SG1 can be alleviated, so that reliability of the memory cells MC0, MCi−1 at both ends of the memory string MSTR can be improved.

A range of a plurality of memory cells MC along one word line WL makes a page, i.e., a unit in which data are collectively read/written. On the other hand, a range of a plurality of NAND cell units 4 arranged in a word line WL direction makes a cell block BLK, i.e., a unit in which data are collectively erased. In the case of the cell array 1 as shown in FIG. 2, k blocks BLK0 to BLKk−1 sharing the bit lines BL in the direction of the bit lines BL are arranged.

The word line WL and the selection gate lines SGL0 and SGL1 are driven by the row decoder/word line driver 2a. Each bit line BL is connected to a sense amplifier SA (SA0 to SAj−1) of the page buffer 3.

In order to achieve a high-density and high-capacity NAND-type flash memory is achieved, the size of the memory cell MC having the above configuration may be reduced. For example, when sidewall transfer process, i.e., one of fine processing techniques, is used, a memory cell MC can be formed by a line and space pattern with a fine pitch exceeding the resolution of lithography technique.

<Data Storage State of Memory Cell>

Subsequently, a data storage state of a memory cell of the NAND-type flash memory according to the present embodiment will be explained.

Figure 3:
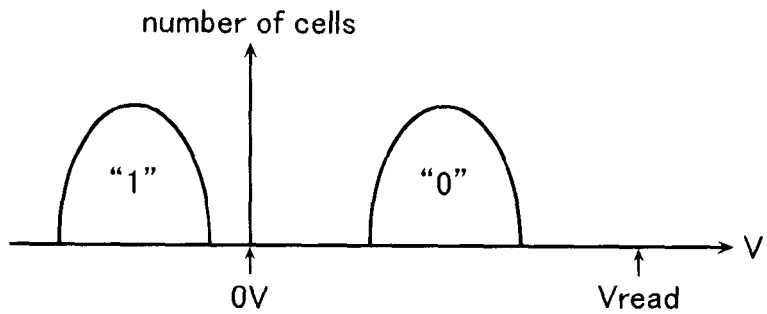
FIGS. 3A and 3B are figures illustrating threshold voltage distributions of a memory cell of the nonvolatile semiconductor storage device according to the embodiment.
Figure 3:
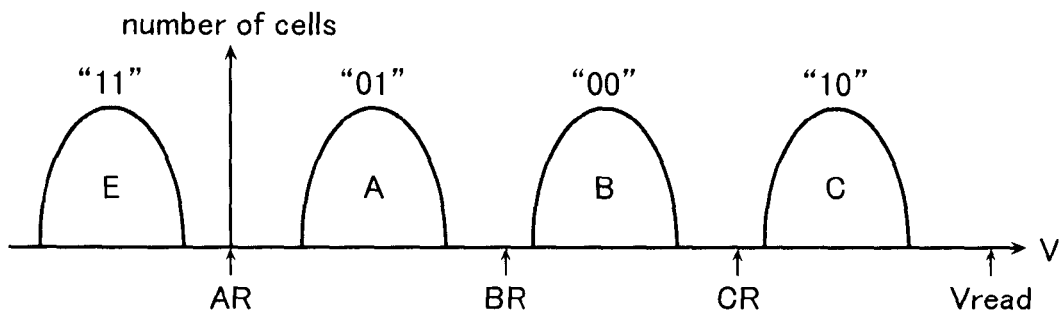

FIGS. 3A and 3B are figures illustrating threshold voltage distributions of the memory cell MC of the NAND-type flash memory according to the present embodiment.

When the memory cell MC of the NAND-type flash memory stores two-value data (one bit/cell), the threshold voltage distribution of the data is as shown in FIG. 3A. A state where the threshold voltage is negative indicates data "1" (erased state), and a state where the threshold voltage is positive indicates data "0".

Where the memory cell MC of the NAND-type flash memory stores four-value data (2 bits/cell), the threshold voltage distribution of the data is as shown in FIG. 3B. In this case, four kinds of threshold voltage distributions (E, A, B, and C) are provided in the ascending order of the threshold voltage. Four types of data "11", "01", "00", and "10" are allocated to the above threshold voltage distributions. In this case, the threshold voltage distribution E is a negative threshold voltage state obtained by collective block erasing according to erase sequence explained later. Voltages AR, BR, CR between the threshold voltage distributions are determination voltages during read operation and verification operation. A voltage Vread (which may be hereinafter referred to as "read pass voltage") is a voltage higher than the upper limit of the highest threshold voltage distribution C. This read pass voltage Vread is a voltage applied to unselected word line WL during read operation.

<Erase Sequence>

Subsequently, erase sequence according to a comparative example of the present embodiment (hereinafter referred to as "the present comparative example") will be explained as a background for explaining the erase sequence of the NAND-type flash memory according to the present embodiment.

Figure 35:
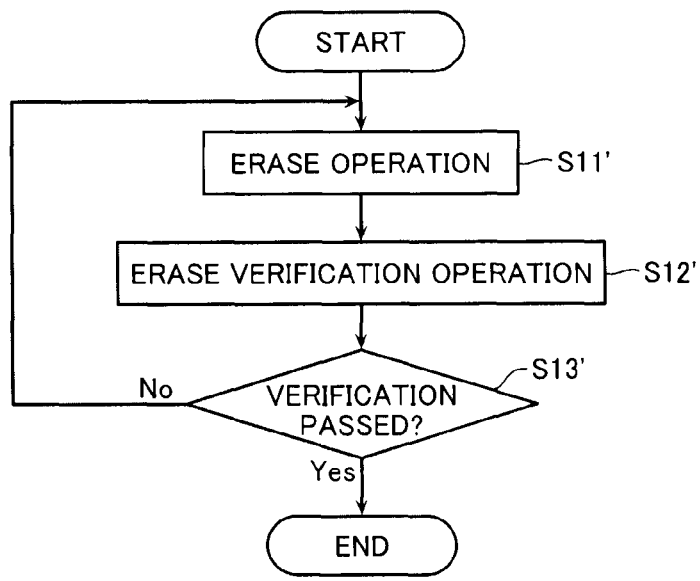
FIG. 35 is a figure illustrating a flow of erase sequence of a nonvolatile semiconductor storage device according to a comparative example of the first embodiment.

FIG. 35 is a figure illustrating a flow of erase sequence according to the present comparative example.

First, in step S11', erase operation is executed to change the threshold voltage of the memory cell MC to erased state.

Figure 36:
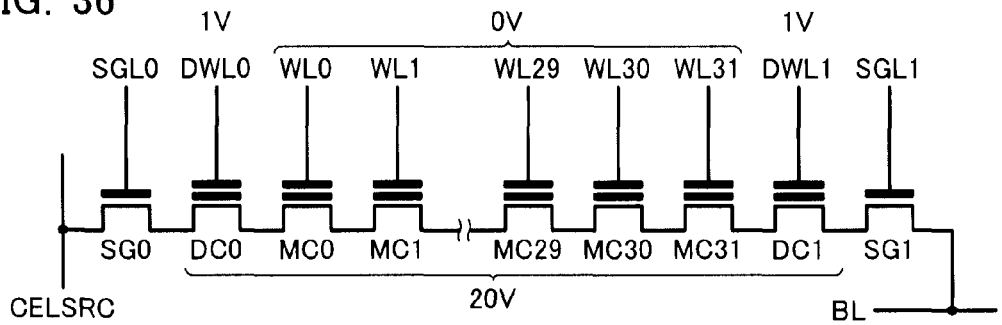
FIG. 36 is a figure illustrating of a bias state of a cell array during erase operation of the nonvolatile semiconductor storage device according to the comparative example.

FIG. 36 is a figure illustrating a bias state of a cell array 1 during erase operation of the present comparative example. The erase operation is executed in units of blocks BLK. In the erase operation, a sequence control circuit 7 controls a high voltage generation circuit 8 and the like to apply an erase voltage Vera (about 10 V to 30 V, and in the case of FIG. 36, the erase voltage Vera is 20 V) to wells formed with memory cells and apply a voltage 0 V to all the word lines WL within the selected block BLK from a word line driver 2a. Accordingly, electrons accumulated in the charge storage layer of each memory cell MC are discharged to a well side an FN tunnel current. In a case of a charge trap-type charge storage layer, holes are injected from the well side.

When the cell array 1 has dummy word lines DWL like the present comparative example, a voltage higher than the word line WL (1 V in the case of FIG. 36) is preferably applied to the dummy word lines DWL as shown in FIG. 36. This voltage is a stress-relaxing voltage for the purpose of alleviating the stress during erase operation performed on the dummy cell DC.

Subsequently, in step S12', erase verification operation is executed to confirm that the memory cells MC have attained erased state.

Figure 37:
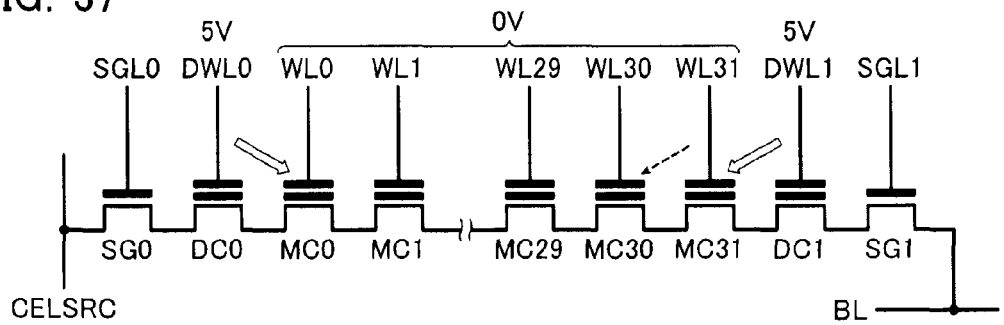
FIG. 37 is a figure illustrating a bias state of a cell array during erase verification operation of the nonvolatile semiconductor storage device according to the comparative example.

FIG. 37 is a figure illustrating a bias state of the cell array 1 during erase verification operation of the comparative example. In this erase verification operation, the sequence control circuit 7 controls the high voltage generation circuit 8 and the like to apply a verification voltage higher than a threshold voltage of the memory cell MC in the erased state (0 V in the case of FIG. 37) to all the word lines WL, and the erase verification operation is achieved by detecting a current flowing in the NAND cell unit 4 with the sense amplifier SA. When the cell array 1 has dummy word lines DWL like the present comparative example, a dummy word line read pass voltage, which is about a level for bringing dummy word lines DWL into conduction, (5 V in the case of FIG. 37) is applied to the dummy word lines DWL. The read pass voltage applied to the word line WL during the write verification operation is a voltage equal to or higher than the highest threshold voltage that can be taken by the memory cell MC. However, in the case of the dummy cell DC, a threshold voltage close to the erased state is attained in step S11', and therefore, the dummy word line read pass voltage may not be as high as the read pass voltage for read operation or write verification operation. This can alleviate electrical stress of the dummy cells DC during the erase verification operation.

Finally, in step S13', a confirmation is made as to whether the erase verification is passed in step S12', and when the erase verification has not been passed, the erase operation in step S11' and the erase verification operation in step S12' are executed again. On the other hand, when the erase verification has been passed, the erase sequence is finished.

With the erase sequence explained above, all the memory cells MC can be made into the erased state in theory.

In the case of the memory cells MC0 and MC31 at both ends of the memory string as shown in FIG. 37, the inter-cell interference is caused by the dummy word lines DWL indicated by outline arrows in FIG. 37. On the other hand, in the case of the other memory cells MC1 to MC30, the inter-cell interference is caused by the word line WL as shown by an arrow of a broken line in FIG. 37. The inter-cell interference effect to the memory cell MC caused by the adjacent word line depends on the voltage applied to the word line. Therefore, it can be said that the memory cells MC0 and MC31 adjacent to the dummy word lines DWL applied with a higher voltage (dummy word line read pass voltage) receive greater inter-cell interference than the other memory cells MC1 to MC31.

Figure 38:
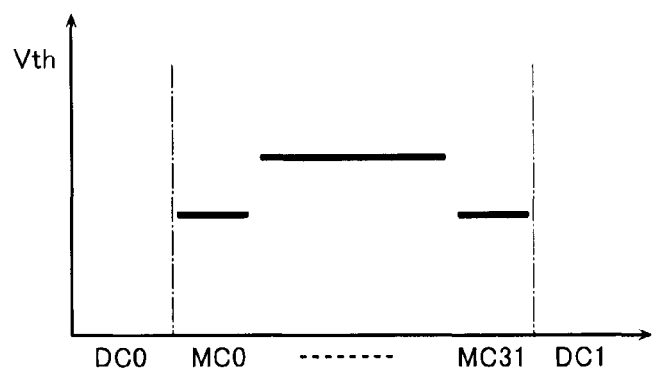
FIG. 38 is a figure illustrating an effective threshold voltage of a memory cell during erase verification operation of the nonvolatile semiconductor storage device according to the comparative example.

In this case, the threshold voltage of the memory cells MC0 and MC31 during the erase verification operation appears to be lower than the threshold voltage of the other memory cells MC1 to MC30 as shown in FIG. 38. In other words, the memory cells MC0 and MC31 at both ends of the memory string are more likely to pass the erase verification than the other memory cells MC1 to MC30.

Figure 39:
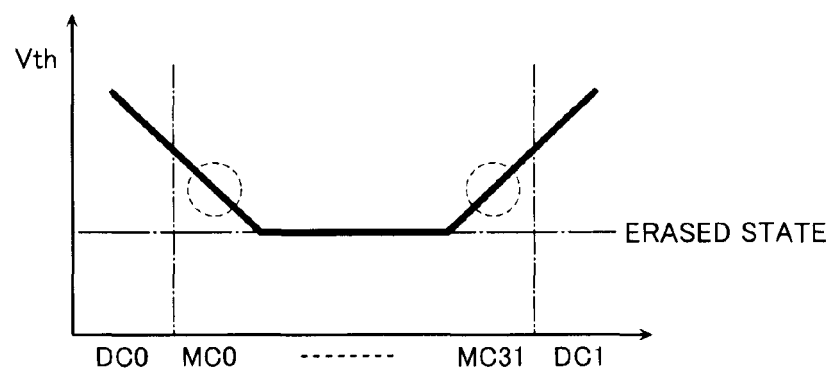
FIG. 39 is a figure illustrating a threshold voltage of a memory cell after erase sequence of the nonvolatile semiconductor storage device according to the comparative example.

As a result, when the erase verification is performed in conformity with the memory cells MC1 to MC31, the erase verification is passed even in a state where the threshold voltage of the memory cells MC0 and MC31 is higher than the erased state as shown by dotted lines in FIG. 39, and this results in an insufficient erase state. On the contrary, when verification is performed which a determination threshold value of the erase verification (for example, AR of FIG. 3) is lower in order to be in conformity with the memory cells MC0 and MC31, the threshold voltage of the memory cells MC1 to MC30 becomes too low, and this results in over-erase state.

Accordingly, in the present embodiment, a bias state of a word line connected to a predetermined memory cell is corrected on the basis of a bias state of a wire adjacent to the predetermined memory cell (word line or dummy word line). Accordingly, the effective threshold voltages of the memory cells during the erase verification operation become the same.

In the explanation below, memory cells which are located at both ends of the memory string and are to be subjected to the erase verification may be referred to as "first target memory cells", and the other memory cells to be subjected to the erase verification may be referred to as "second target memory cells". More specifically, in the present embodiment, the memory cells MC0 and MC31 are the first target memory cells, and the other memory cells MC1 to MC30 are the second target memory cells.

Figure 4:
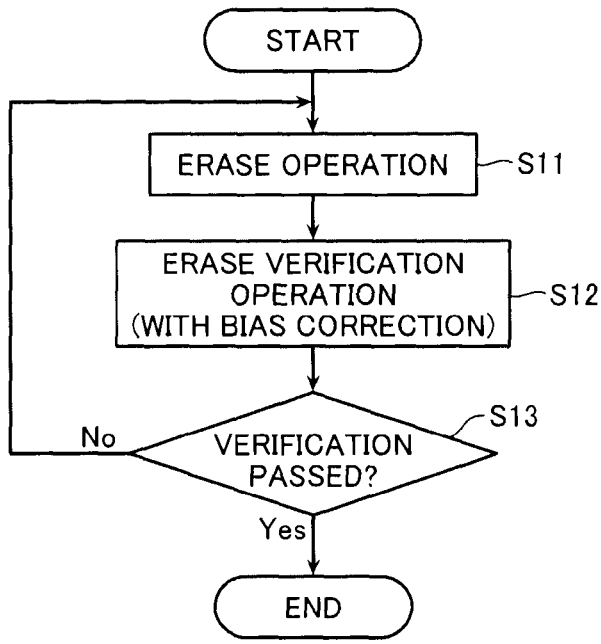
FIG. 4 is a figure illustrating a flow of an erase sequence of the nonvolatile semiconductor storage device according to the embodiment.

FIG. 4 is a figure illustrating a flow of erase sequence of the present embodiment.

Steps S11 to S13 as shown in FIG. 4 correspond to steps S11' to S13' as shown in FIG. 35, respectively. However, in the explanation below, step S12, i.e., a step different from the comparative example, will be explained. Explanation about the other steps similar to those of the comparative example is omitted.

Figure 5:
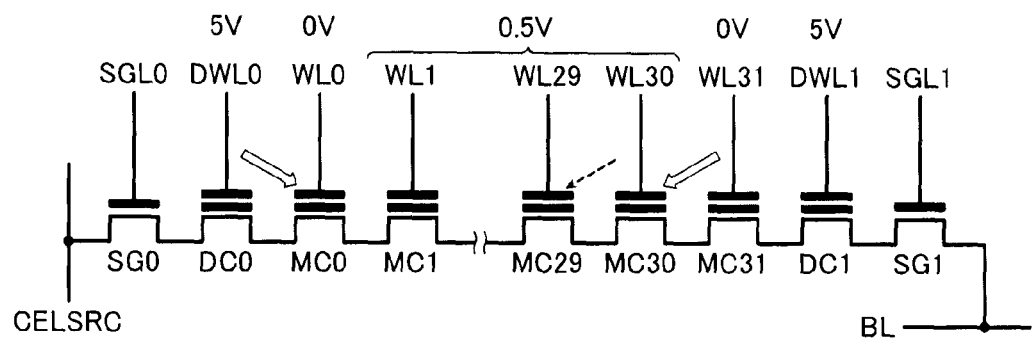
FIG. 5 is a figure illustrating a bias state of a cell array during erase verification operation of the nonvolatile semiconductor storage device according to the embodiment.

In the erase verification operation in step S12, for example, as shown in FIG. 5, a verification voltage (a first selection wire voltage; 0 V in the case of FIG. 5) less than verification voltages (a second selection wire voltage and a third selection wire voltage; 0.5 V in the case of FIG. 5) applied to word lines WL1 to WL30 connected to the second target memory cells MC1 to MC30 (MC1 and MC30 are second memory cells, and MC2 to MC29 are third memory cells) is applied to word lines WL0 and WL31 connected to the first target memory cells MC0 and MC31 (first memory cells).

Accordingly, the effective threshold voltage of the first target memory cells MC0 and MC31 relatively increases with respect to the effective threshold voltage of the second target memory cells MC1 to MC30, and the effective threshold voltages of all the memory cells MC0 to MC31 during the erase verification operation can be made the same.

Figure 6:
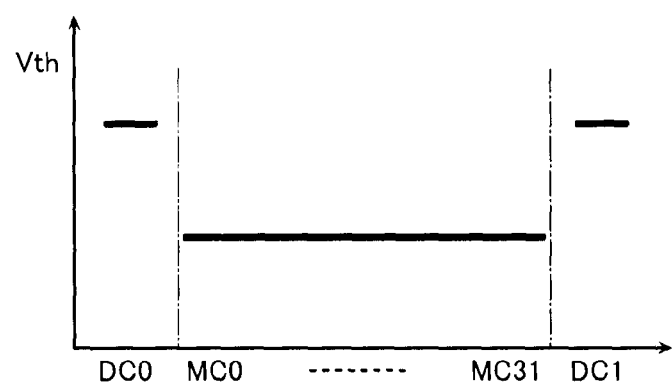
FIG. 6 is a figure illustrating a threshold voltage of a memory cell after the erase sequence of the nonvolatile semiconductor storage device according to the embodiment.

As a result, as shown in FIG. 6, the threshold voltages of all the memory cells MC0 to MC31 having been subjected to the erase sequence can be made substantially the same. Therefore, this can prevent the threshold voltages of the first target memory cells MC0 and MC31 from becoming excessively higher than the threshold voltage of the erased state and prevent the threshold voltage of the second target memory cells MC1 to MC30 from becoming excessively lower than the threshold voltage of the erased state, which may occur in the comparative example.

In other words, the present embodiment can reduce a writing false data which is caused by variation of the threshold voltage of each memory cell having been subjected to the erase sequence, and according to the present embodiment, the NAND-type flash memory with a high degree of reliability with regard to write and erase operations of data can be provided.

[Second Embodiment]

The second embodiment is an embodiment relating to a NAND-type flash memory that employs erase verification operation according to a so-called alternate method explained later.

First, erase sequence according to a comparative example of the present embodiment (hereinafter referred to as "the present comparative example") will be explained as a background for explaining the present embodiment.

Figure 40:
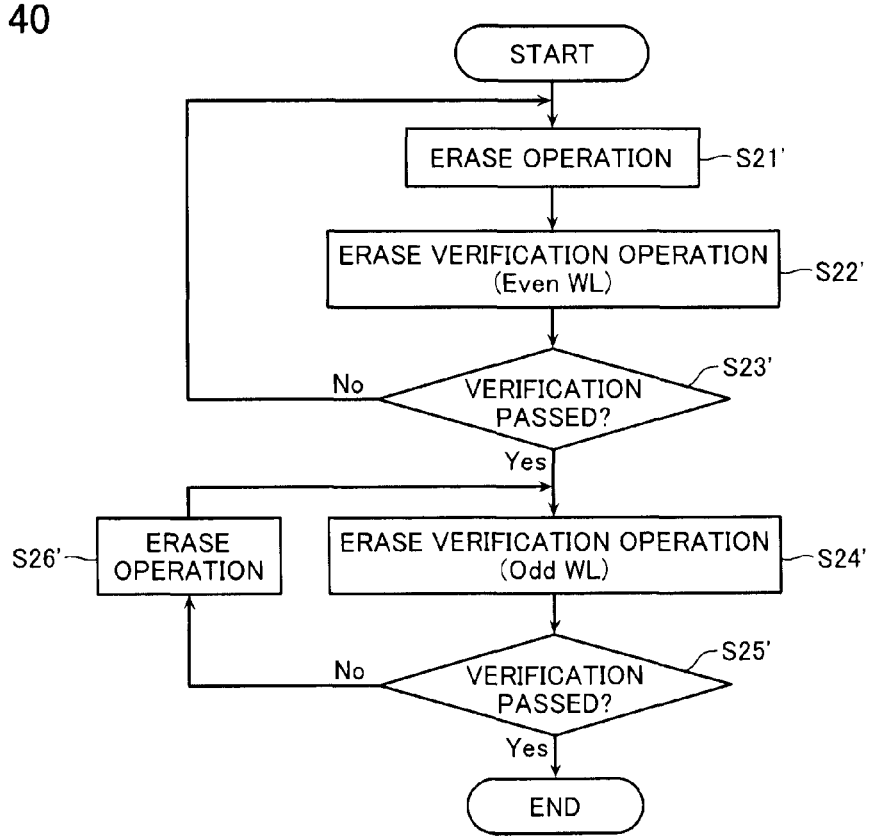
FIG. 40 is a figure illustrating a flow of erase sequence of a nonvolatile semiconductor storage device according to a comparative example of the second embodiment.

FIG. 40 is a figure illustrating a flow of erase sequence of the present comparative example.

First, erase operation is executed in step S21'. This erase operation is the same as step S11' as shown in FIG. 35.

Subsequently, in step S22', erase verification operation is executed. However, in the present embodiment, the erase verification operation according the alternate method is executed so as to separately erase pages (hereinafter referred to as "even-numbered pages") selected by even-numbered word lines WLe (e is an even number) and pages (hereinafter referred to as "odd-numbered pages") selected by odd-numbered word lines WLo (o is an odd number).

According to the erase verification operation of this alternate method, the number of word lines WL selected in one verification operation is reduced to half as compared with the case where all the word lines WL are selected like the first embodiment. Accordingly, the channel resistance of the memory cell connected to each unselected word line WL of the NAND cell unit 4 can be reduced, and a higher level of cell current can be ensured. As a result, even with the same charging time, a false read operation can be reduced.

Then, in this step S22', the erase verification operation is executed on the even-numbered pages.

Figure 41:
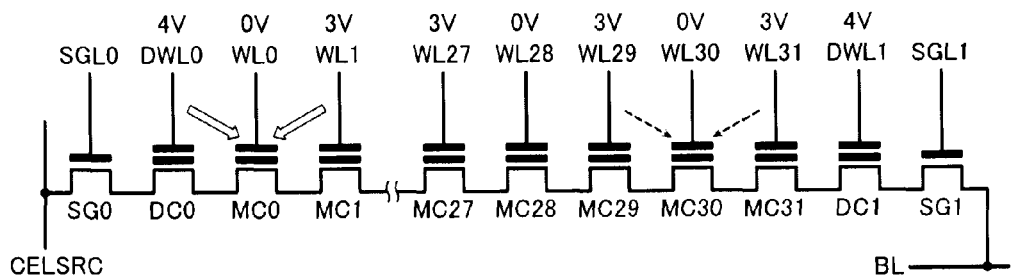
FIG. 41 is a figure illustrating a bias state of a cell array during erase verification operation of the nonvolatile semiconductor storage device according to the comparative example.

FIG. 41 is a figure illustrating a bias state of a cell array 1 during erase verification operation on even-numbered pages. In this erase verification operation, a verification voltage (0 V in the case of FIG. 41) is applied to the even-numbered word lines WLe, a read pass voltage (3 V in the case of FIG. 41) is applied to the odd-numbered word lines WLo, and a dummy word line read pass voltage (4 V in the case of FIG. 41) is applied to the dummy word lines DWL. Then, the erase verification operation is achieved by detecting whether a current flows in the NAND cell unit 4 with a sense amplifier SA. The memory cells connected to the odd-numbered word lines WLo attain threshold voltages close to the erased state is in step S11', and therefore, the read pass voltage may not be as high as the read pass voltage for read operation or write verification operation. Accordingly, this can alleviate electrical stress of the odd-numbered memory cell MCo connected to the odd-numbered word lines WLo during the erase verification operation.

Subsequently, in step S23', a confirmation is made as to whether the erase verification is passed in step S22', and when the erase verification has not been passed, the erase operation in step S21' and the erase verification operation on the even-numbered page in step S22' are executed again. On the other hand, when the erase verification has been passed, the processing in step S24' is performed.

Subsequently, in step S24', erase verification operation is executed on the odd-numbered pages.

Figure 42:
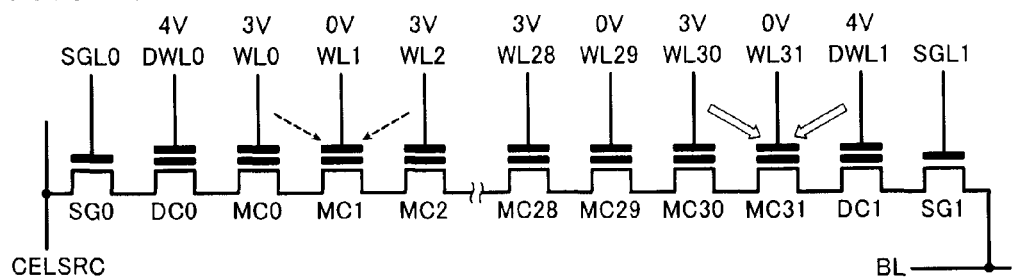
FIG. 42 is a figure illustrating a bias state of a cell array during erase verification operation of the nonvolatile semiconductor storage device according to the comparative example.

FIG. 42 is a figure illustrating a bias state of a cell array 1 during erase verification operation performed on the odd-numbered pages. In this erase verification operation, a verification voltage (0 V in the case of FIG. 42) is applied to the odd-numbered word lines WLo, a read pass voltage (3 V in the case of FIG. 42) is applied to the even-numbered word lines WLe, and a dummy word line read pass voltage (4 V in the case of FIG. 42) is applied to the dummy word lines DWL. Then, the erase verification operation is achieved by detecting whether a current flows in the NAND cell unit 4 with a sense amplifier SA.

Finally, in step S25', a confirmation is made as to whether the erase verification is passed in step S24', and when the erase verification has not been passed, the same erase operation as that of step S21' is executed in step S26', and thereafter the erase verification operation of step S24' is executed again on the odd-numbered pages. On the other hand, when the erase verification has been passed, the erase sequence is finished.

Ideally, all the memory cells MC can attain erased state by the erase sequence explained above.

In the case of the erase verification operation performed on the even-numbered pages according to the present comparative example, the first target memory cell MC0 which is located at both ends of the memory string and is to be subjected to the erase verification receives the inter-cell interference from the dummy word line DWL0 applied with the dummy word line read pass voltage of 4 V and the word line WL1 applied with the read pass voltage of 3 V indicated by outline arrows in FIG. 41. On the other hand, the second target memory cells MC2, MC4, . . . , MC30, i.e., the other memory cells to be subjected to the erase verification, receive the inter-cell interference effect from the two word lines WLe applied with the read pass voltage of 3 V indicated by arrows of broken lines in FIG. 41. In other words, the first target memory cell MC0 receives greater inter-cell interference than the second target memory cells MC2, MC4, . . . , MC30.

Likewise, in the case of the erase verification operation performed on the odd-numbered pages according to the present comparative example, the first target memory cell MC31 which is located at both ends of the memory string and is to be subjected to the erase verification receives greater inter-cell interference than the second target memory cells MC1, MC3, . . . , MC29, i.e., the other memory cells to be subjected to the erase verification, as shown in FIG. 42.

In other words, when the erase verification operation performed on the even-numbered pages and the erase verification operation performed on the odd-numbered pages are considered together, the threshold voltage of the first target memory cells MC0 and MC31 appears to be lower than the threshold voltage of the second target memory cells MC1 to MC31 like the first embodiment as shown in FIG. 38.

Accordingly, like the first embodiment, the present embodiment is also configured such that the bias state of the word lines connected to the first target memory cells and the bias state of the word lines connected to the second target memory cell are corrected, so that the effective threshold voltages of the memory cells during the erase verification operation become the same.

Figure 7:
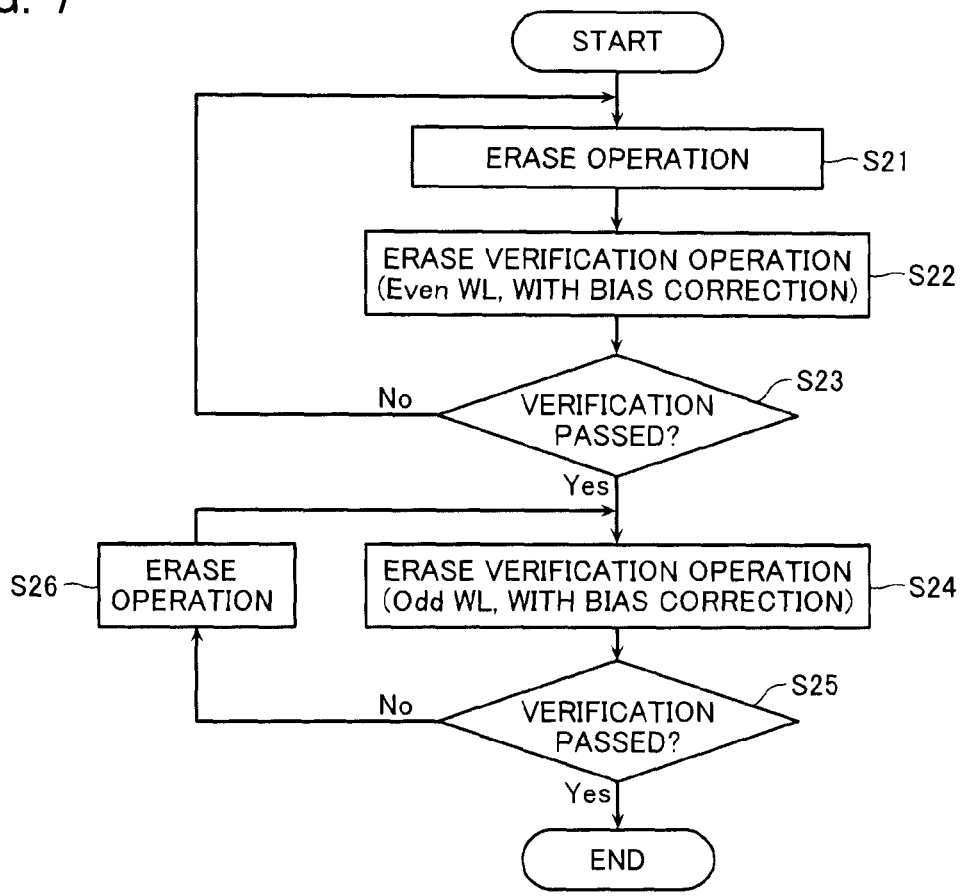
FIG. 7 is a figure illustrating a flow of erase sequence of a nonvolatile semiconductor storage device according to a second embodiment.

FIG. 7 is a figure illustrating a flow of erase sequence of the present embodiment.

Steps S21 to S26 as shown in FIG. 7 correspond to steps S21' to S26' as shown in FIG. 40, respectively. However, in the explanation below, steps S22 and S24, i.e., steps different from the comparative example, will be explained. Explanation about the other steps similar to those of the comparative example is omitted.

Figure 9:
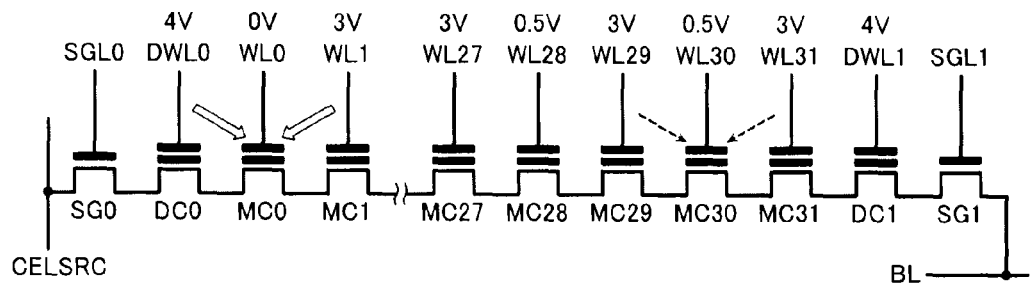
FIG. 9 is a figure illustrating a bias state of a cell array during erase verification operation of the nonvolatile semiconductor storage device according to the embodiment.

The erase verification operation performed on the even-numbered pages in step S22 is the same as step S22' according to the comparative example in that the inter-cell interference effect (outline arrows in FIG. 9) received by the first target memory cell MC0 (first target cell) is greater than the inter-cell interference effect (arrows of broken lines in FIG. 9) received by the second target memory cells MC2, MC4, . . . , MC30 (second target cells).

Therefore, a verification voltage (third wire voltage, 0 V in the case of FIG. 5) lower than a verification voltage (third wire voltage, 0.5 V in the case of FIG. 9) applied to the word lines WL2, WL4, . . . , WL30 connected to the second target memory cells MC2, MC4, . . . , MC30 is applied to the word line WL0 connected to the first target memory cell MC0.

Accordingly, the effective threshold voltage of the first target memory cell MC0 relatively increases with respect to the effective threshold voltage of the second target memory cells MC2, MC4, . . . , MC30, and the effective threshold voltages of the even-numbered memory cell MCe during the erase verification operation performed on the even-numbered pages can be made about the same.

Figure 10:
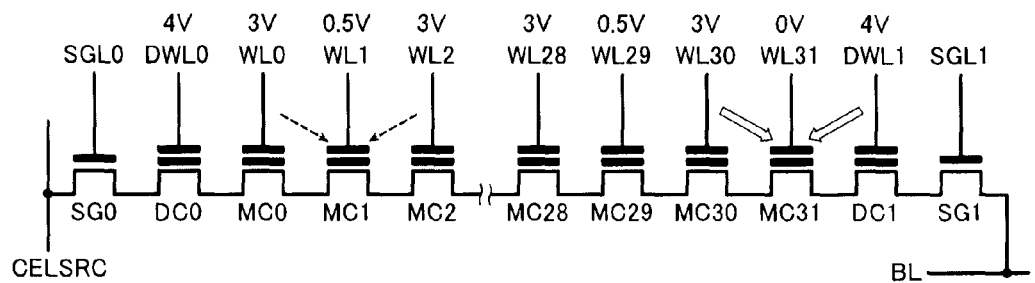
FIG. 10 is a figure illustrating a bias state of a cell array during erase verification operation of the nonvolatile semiconductor storage device according to the embodiment.

Subsequently, the erase verification operation performed on the odd-numbered pages in step S24 is the same as step S24' according to the comparative example in that the inter-cell interference effect (outline arrows in FIG. 10) received by the first target memory cell MC31 is greater than the inter-cell interference effect (arrows of broken lines in FIG. 10) received by the second target memory cells MC1, MC3, . . . , MC29.

Therefore, a verification voltage (third wire voltage, 0 V in the case of FIG. 10) lower than a verification voltage (third wire voltage, 0.5 V in the case of FIG. 10) applied to the word lines WL1, WL3, . . . , WL29 connected to the second target memory cells MC1, MC3, . . . , MC29 is applied to the word line WL31 connected to the first target memory cell MC31.

Accordingly, the effective threshold voltage of the first target memory cell MC31 relatively increases with respect to the effective threshold voltage of the second target memory cells MC1, MC3, . . . , MC29, and the effective threshold voltages of the odd-numbered memory cell MCo during the erase verification operation performed on the odd-numbered pages can be made about the same.

In other words, when the erase verification operation performed on the even-numbered pages and the erase verification operation performed on the odd-numbered pages are considered together, the effective threshold voltages of all the memory cells MC0 to MC31 during the erase verification operation can be made about the same, and as a result, like the first embodiment as shown in FIG. 6, the threshold voltages of all the memory cells MC0 to MC31 having been subjected to the erase sequence can be made substantially the same.

Therefore, according to the present embodiment, the same effects as those of the first embodiment can be obtained even with the NAND-type flash memory employing the erase verification operation according to the alternate method.

[Third Embodiment]

Like the second embodiment, the third embodiment is also an embodiment relating to a NAND-type flash memory that employs the erase verification operation according to the alternate method. In this case, erase verification operation performed on even-numbered pages and odd-numbered pages, which is different from the second embodiment, will be mainly explained. Description other than the erase verification operation is omitted.

First, the erase sequence according to a comparative example of the present embodiment (hereinafter referred to as "the present comparative example") will be explained as a background for explaining the present embodiment.

Figure 43:
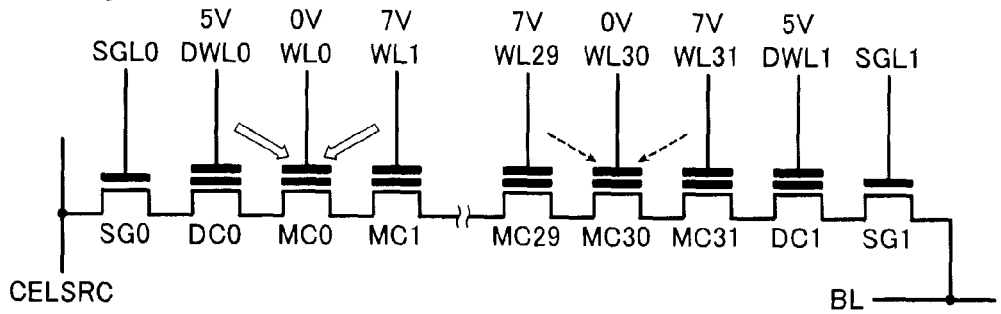
FIG. 43 is a figure illustrating a bias state of a cell array during erase verification operation of a nonvolatile semiconductor storage device according to a comparative example of the third embodiment.

The erase sequence operation performed on even-numbered pages according to the present comparative example is different from that of the second embodiment in that, as shown in FIG. 43, a read pass voltage (7 V in the case of FIG. 43) higher than the dummy word line read pass voltage (5 V in the case of FIG. 43) applied to the dummy word lines DWL is applied to odd-numbered word lines WLo. Since the dummy cells DC are not used as memory cells, the dummy cells DC may be used not to perform write operation. When the number of bits of data stored in the memory cell MC is small, the erase data may be made higher in order to improve the reliability. For example, this means that, when the memory cell MC stores two-value data (1 bit/cell), the upper limit of data "1" (erased state) in which the threshold voltage is a negative state may be set at a level higher than a case where multi-value data are stored (when two-value data are stored, the upper limit of the threshold voltage is a positive state, which may results in a threshold value distribution ranging over positive and negative). As a result, the read pass voltage may be higher than the dummy word line read pass voltage.

In this case, in the case of the present comparative example, the second target memory cells MC2, MC4, . . . , MC30 receive greater inter-cell interference than the first target memory cell MC0.

Figure 44:
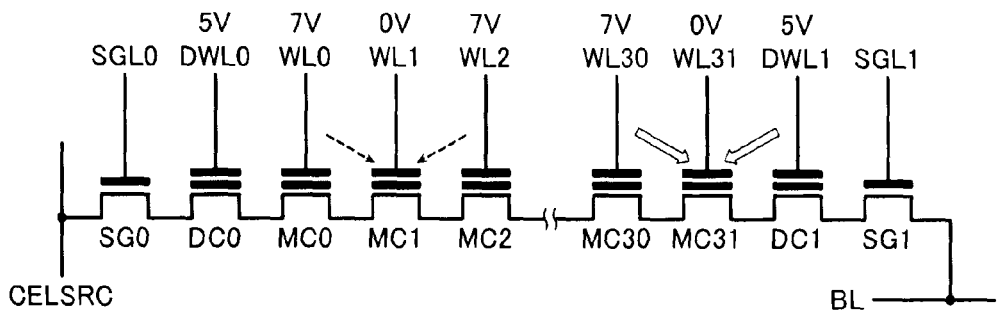
FIG. 44 is a figure illustrating a bias state of a cell array during erase verification operation of the nonvolatile semiconductor storage device according to the comparative example.

Likewise, the erase sequence operation performed on odd-numbered pages according to the present comparative example is different from that of the second embodiment in that, as shown in FIG. 44, a read pass voltage (7 V in the case of FIG. 43) higher than the dummy word line read pass voltage (5 V in the case of FIG. 44) applied to the dummy word lines DWL is applied to even-numbered word lines WLe.

Therefore, in the case of the present comparative example, the second target memory cells MC1, MC3, . . . , MC29 receive greater inter-cell interference than the first target memory cell MC31.

In other words, when the erase verification operation performed on the even-numbered pages and the erase verification operation performed on the odd-numbered pages are considered together, the threshold voltage of the first target memory cells MC0 and MC31 appears to be greater than the threshold voltage of the second target memory cells MC1 to MC31. In other words, the first target memory cells MC0 and MC31 are less likely to pass the erase verification as compared with the second target memory cells MC1 to MC30.

Figure 45:
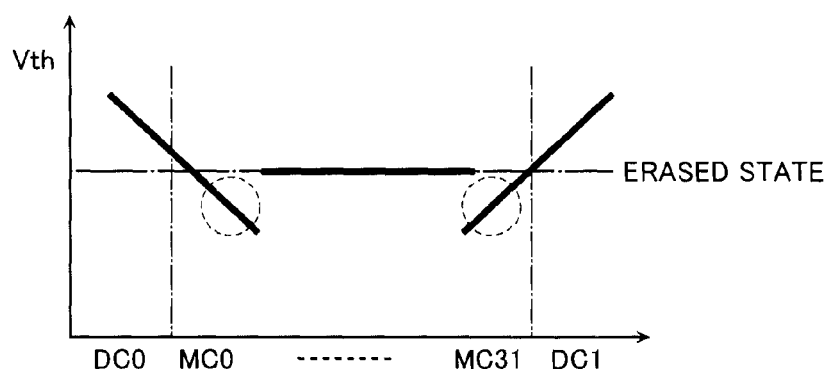
FIG. 45 is a figure illustrating a threshold voltage of a memory cell after erase sequence of the nonvolatile semiconductor storage device according to the comparative example.

As a result, the threshold voltage of the first target memory cells MC0 and MC31 having been subjected to the erase sequence becomes too low, and is in over-erase state indicated by circles of broken lines in FIG. 45.

Accordingly, in contrast to the first and second embodiments, the present embodiment is configured such that a verification voltage higher than the verification voltage applied to the word lines connected to the second target memory cells is applied to the word lines connected to the first target memory cells.

Figure 11:
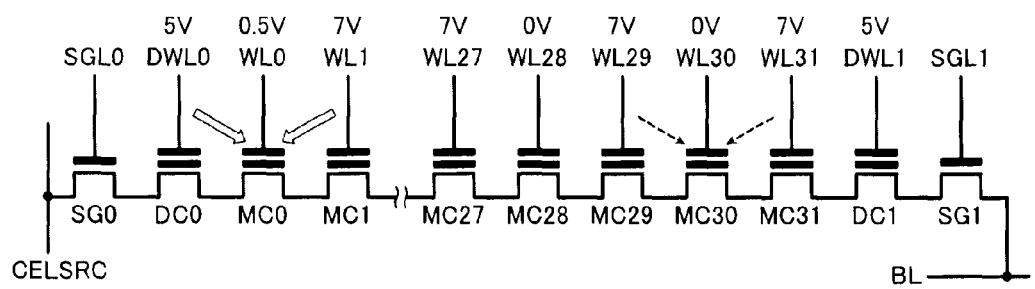
FIG. 11 is a figure illustrating a bias state of a cell array during erase verification operation of a nonvolatile semiconductor storage device according to a third embodiment.

In other words, in the erase verification operation performed on the even-numbered page, for example, as shown in FIG. 11, a verification voltage of 0.5 V is applied to the word line WL0 connected to the first target memory cell MC0, and a verification voltage of 0 V is applied to the word lines WL2, WL4, . . . , WL30 connected to the second target memory cells MC2, MC4, . . . , MC30.

Accordingly, the effective threshold voltage of the first target memory cell MC0 relatively decreases with respect to the effective threshold voltage of the second target memory cells MC2, MC4, . . . , MC30, and the effective threshold voltages of the even-numbered memory cell MCe during the erase verification operation performed on the even-numbered pages can be made about the same.

Figure 12:
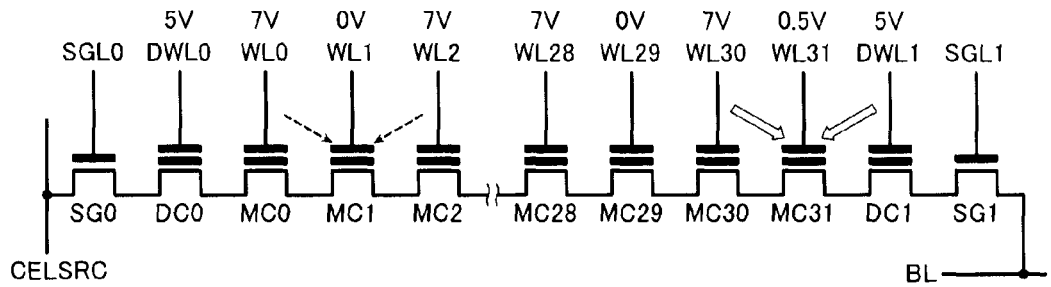
FIG. 12 is a figure illustrating a bias state of a cell array during erase verification operation of the nonvolatile semiconductor storage device according to the embodiment.

In the erase verification operation performed on the odd-numbered pages, for example, as shown in FIG. 12, a verification voltage of 0.5 V is applied to the word line WL31 connected to the first target memory cell MC31, and a verification voltage of 0 V is applied to word lines WL1, WL3, . . . , WL29 connected to second target memory cells MC1, MC3, . . . , MC29.

Accordingly, the effective threshold voltage of the first target memory cell MC31 relatively decreases with respect to the effective threshold voltage of the second target memory cells MC1, MC3, . . . , MC29, and the effective threshold voltages of the odd-numbered memory cell MCo during the erase verification operation performed on the odd-numbered pages can be made about the same.

In other words, when the erase verification operation performed on the even-numbered pages and the erase verification operation performed on the odd-numbered pages are considered together, the effective threshold voltages of all the memory cells MC0 to MC31 during the erase verification operation can be made about the same, and as a result, like the first embodiment as shown in FIG. 6, the threshold voltages of all the memory cells MC0 to MC31 having been subjected to the erase sequence can be made substantially the same.

Figure 8:
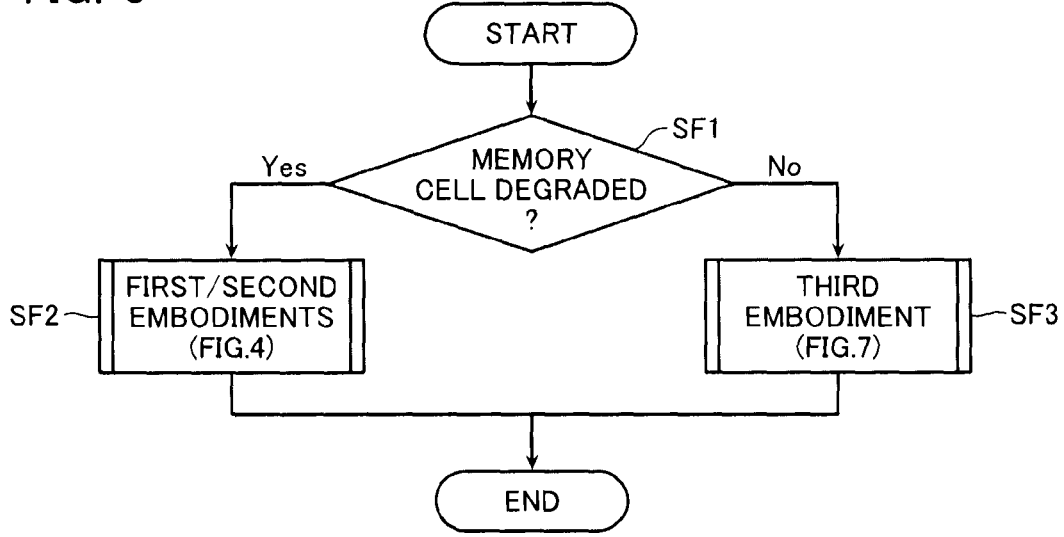
FIG. 8 is a figure illustrating a flow of erase sequence of a nonvolatile semiconductor storage device according to considering of degradation of the memory cell.

Therefore, according to the present embodiment, the same effects as those of the first and second embodiments can be obtained even with the NAND-type flash memory employing the erase verification operation according to the alternate method even when the read pass voltage is higher than the dummy word line read pass voltage. Even when the write operation is not performed on the dummy cells DC, the threshold voltages of all the memory cells MC0 to MC31 having been subjected to the erase sequence can be made substantially the same. As shown FIG. 8, when the memory cell MC is not degraded (step SF1), the erase verification operation of the first embodiment or the second embodiment can be used (step SF2). When the memory cell MC is degraded, the erase verification operation of the third embodiment can be used (step SF3). At this point, judgment of degradation of the memory cell MC may be based on number of erase operation or number of write/erase cycle. As a result, regardless of the level of degradation of the memory cell MC, the threshold voltages of all the memory cells MC0 to MC31 having been subjected to the erase sequence can be made substantially the same.

[Fourth Embodiment]

Like the second and third embodiments, the fourth embodiment is also an embodiment relating to a NAND-type flash memory that employs the erase verification operation according to the alternate method. In this case, erase verification operation performed on even-numbered pages and odd-numbered pages, which is different from the second and third embodiments, will be mainly explained. Description other than the erase verification operation is omitted.

Figure 13:
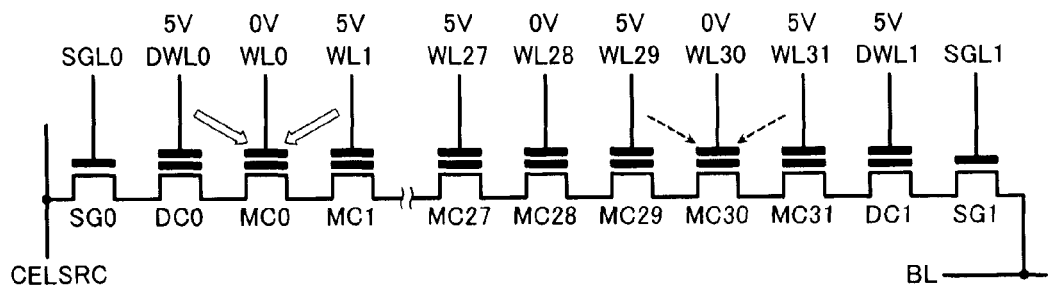
FIG. 13 is a figure illustrating a bias state of a memory cell array during erase verification operation of a nonvolatile semiconductor storage device according to a fourth embodiment.

The erase sequence operation performed on even-numbered pages according to the present embodiment is different from the second and third embodiments in that, as shown in FIG. 13, the same read pass voltage (5 V in the case of FIG. 13) as the dummy word line read pass voltage (5 V in the case of FIG. 13) applied to the dummy word lines DWL is applied to odd-numbered word lines WLo. By doing so, the inter-cell interference effect received by the first target memory cell MC0 (outline arrows in FIG. 13) and the inter-cell interference effect received by the second target memory cells MC2, MC4, . . . , MC30 (arrows of broken lines in FIG. 13) can be made about the same. Accordingly, the effective threshold voltages of the even-numbered memory cell MCe during the erase verification operation performed on the even-numbered pages can be made about the same.

Figure 14:
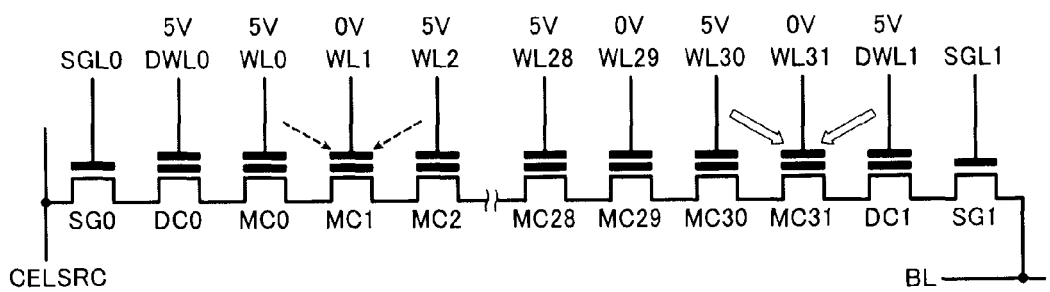
FIG. 14 is a figure illustrating a bias state of a cell array during erase verification operation of the nonvolatile semiconductor storage device according to the embodiment.

Likewise, the case of the erase sequence operation performed on odd-numbered pages according to the present embodiment is different from the second and third embodiments in that the same read pass voltage (5 V in the case of FIG. 14) as the dummy word line read pass voltage (5 V in the case of FIG. 14) applied to the dummy word lines DWL is applied to even-numbered word lines WLe as shown in FIG. 14. As a result, the inter-cell interference effect received by the first target memory cell MC31 (arrows of solid lines in FIG. 14) and the inter-cell interference effect received by the second target memory cells MC1, MC3, . . . , MC29 (arrows of broken lines in FIG. 14) can be made about the same. Accordingly, the effective threshold voltages of the odd-numbered memory cell MCo during the erase verification operation performed on the odd-numbered pages can be made substantially the same.

Figure 15:
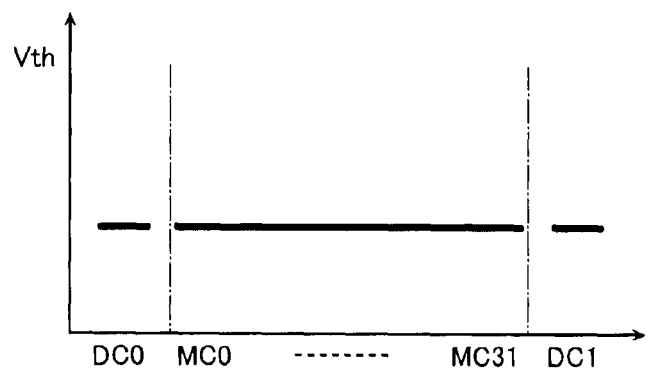
FIG. 15 is a figure illustrating a threshold voltage of a memory cell after erase sequence of the nonvolatile semiconductor storage device according to the embodiment.

In other words, when the erase verification operation performed on the even-numbered pages and the erase verification operation performed on the odd-numbered pages are considered together, the effective threshold voltages of all the memory cells MC0 to MC31 during the erase verification operation can be made about the same, and as a result, as shown in FIG. 15, the threshold voltages of all the memory cells MC0 to MC31 having been subjected to the erase sequence can be made about the same.

Therefore, according to the present embodiment, the same effects as those of the second and third embodiments can be obtained even with the NAND-type flash memory employing the erase verification operation according to the alternate method by making the read pass voltage and the dummy word line read pass voltage the same. In addition, by making the dummy word line read pass voltage and the read pass voltage the same, a peripheral circuit such as the high voltage generation circuit 8 can be simplified as compared with the second and third embodiments.

[Fifth Embodiment]

The first to fourth embodiments are embodiments relating to the NAND-type flash memory in which one dummy word line DWL is provided at each of both ends of the memory string. In contrast, the fifth to seventh embodiments are embodiments relating to a NAND-type flash memory in which two dummy word lines DWL are provided at each of both ends of the memory string.

For the sake of convenience, structure and erase verification operation of a NAND cell unit 4 different from the first embodiment will be explained. Description other than the structure and the erase verification operation is omitted.

Figure 16:
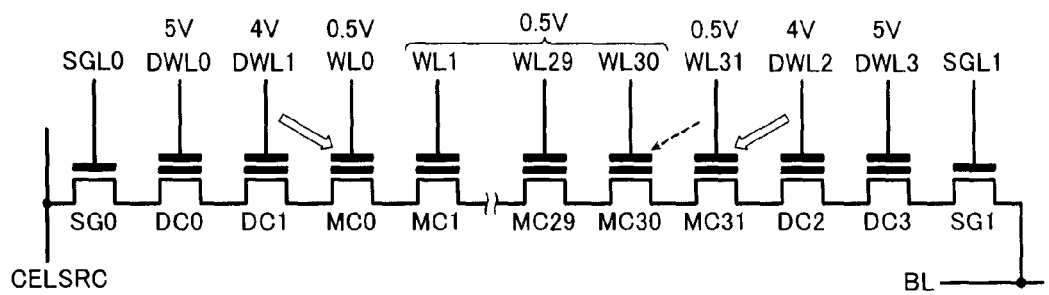
FIG. 16 is a figure illustrating a bias state of a cell array during erase verification operation of a nonvolatile semiconductor storage device according to a fifth embodiment.

FIG. 16 is a figure illustrating a bias state of a cell array 1 during erase verification operation according to the fifth embodiment.

As shown in FIG. 16, the NAND-type flash memory according to the present embodiment includes two dummy cells, i.e., a dummy cell DC0 (second dummy cell) and a dummy cell DC1 (first dummy cell), provided between a memory cell MC0 (first memory cell) and a selection gate transistor SG0, two dummy cells, i.e., a dummy cell DC2 (first dummy cell) and a dummy cell DC3 (second dummy cell), provided between a memory cell MC31 (first memory cell) and a selection gate transistor SG1, and dummy word lines DWL0 to DWL3 (dummy wire) connected to the control gates of the dummy cells DC0 to DC3, respectively. A verification voltage of 0.5 V is applied to all of word lines WL0 to WL31.

In the erase verification operation according to the present embodiment, as shown in FIG. 16, a dummy word line read pass voltage of 5 V (second dummy wire voltage) is applied to dummy word lines DWL0 and DWL3 close to selection gate transistors SG0 and SG1, and a dummy word line read pass voltage of 4 V (first dummy wire voltage) is applied to dummy word lines DWL1 and DWL2 close to the memory string.

Figure 46:
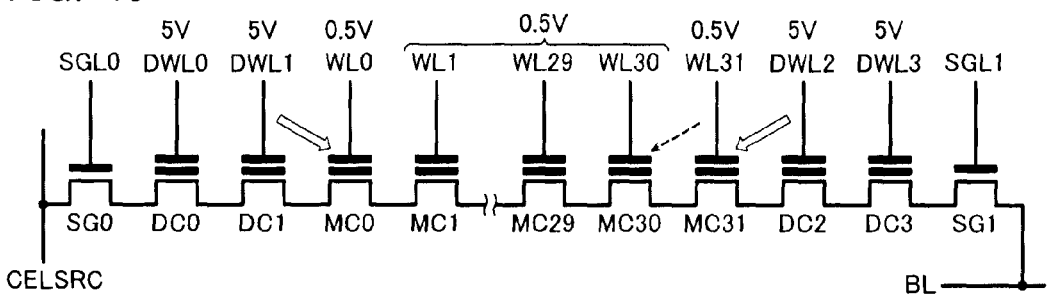
FIG. 46 is a figure illustrating a bias state of a cell array during erase verification operation of a nonvolatile semiconductor storage device according to a comparative example of the fifth embodiment.

In this case, the comparative example of the present embodiment will be explained with reference to FIG. 46. In the comparative example, a dummy word line read pass voltage of 5 V is respectively applied to the dummy word lines DWL0 and DWL3 close to the selection gate transistors SG0 and SG1 and the dummy word lines DWL1 and DWL2 close to the memory string. In other words, the same voltage is applied to all the dummy word lines DWL. Further, the verification voltage of 0.5 V is applied to all the word lines WL0 to WL31. In other words, the memory cells MC0 and MC31 at both ends of the memory string as shown in FIG. 46 receives the inter-cell interference caused by the dummy word lines DWL1, DWD2. On the other hand, the other memory cells MC1 to MC30 receive the inter-cell interference from the word lines WL. The inter-cell interference effect to the memory cell MC caused by the adjacent word line depends on the voltage applied to the word line. Therefore, it can be said that the memory cells MC0 and MC31 adjacent to the dummy word lines DWL applied with a higher voltage (dummy word line read pass voltage) receive greater inter-cell interference than the other memory cells MC1 to MC31.

In this case, the threshold voltage of the memory cells MC0 and MC31 during the erase verification operation appears to be lower than the threshold voltage of the other memory cells MC1 to MC30. In other words, the memory cells MC0 and MC31 at both ends of the memory string are more likely to pass the erase verification than the other memory cells MC1 to MC30.

As a result, when the erase verification operation is executed according to the condition in conformity with the memory cells MC1 to MC30, the erase verification is passed even in a state where the threshold voltage of the memory cells MC0 and MC31 is higher than the erased state, and this results in an insufficient erase state. On the contrary, when the erase verification operation is executed with a lower determination threshold value of the erase verification in order to be in conformity with the memory cells MC0 and MC31, the memory cells MC1 to MC30 are in over-erase state, i.e., the threshold voltage of the memory cells MC1 to MC30 becomes too low.

On the other hand, in the present embodiment, the dummy word line read pass voltage applied to the dummy word lines DWL1 and DWL2 close to the memory string is reduced. In other words, the dummy word line read pass voltage applied to the dummy word line DWL1 is lower than the dummy word line read pass voltage applied to the dummy word line DWL0. The dummy word line read pass voltage applied to the dummy word line DWL2 is lower than the dummy word line read pass voltage applied to the dummy word line DWL3.

Figure 18:
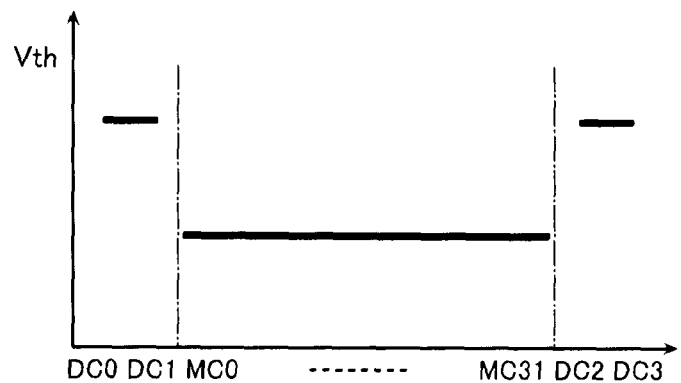
FIG. 18 is a figure illustrating a threshold voltage of a memory cell after erase sequence of the nonvolatile semiconductor storage device according to the embodiment.

Accordingly, the effective threshold voltage of the first target memory cells MC0 and MC31 relatively increases with respect to the effective threshold voltage of the second target memory cells MC1 to MC30, and the effective threshold voltages of all the memory cells MC0 to MC31 during the erase verification operation can be made substantially the same. As a result, as shown in FIG. 18, the threshold voltages of the memory cells MC0 to MC31 having been subjected to the erase sequence can be made about the same.

Therefore, according to the present embodiment, the same effects as those of the first embodiment can be obtained even when two dummy word lines are provided at each of the both ends of the memory string.

By reducing the relatively high potentials of the dummy word lines, the effects of reducing the consumed current and achieving fast operation can be obtained.

[Sixth Embodiment]

The present embodiment is a modification of the fifth embodiment.

In this case, structure and erase verification operation of a NAND cell unit 4 different from the fifth embodiment will be explained. Description other than the structure and the erase verification operation is omitted.

Figure 17:
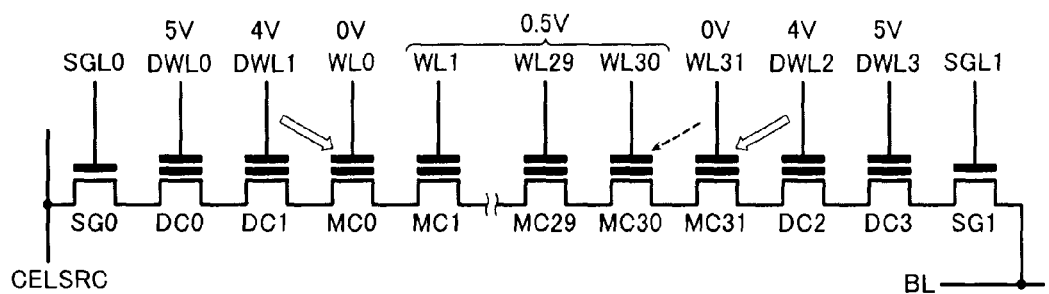
FIG. 17 is a figure illustrating a bias state of a cell array during erase verification operation of a nonvolatile semiconductor storage device according to a sixth embodiment.

FIG. 17 is a figure illustrating a bias state of a cell array 1 during erase verification operation according to the present embodiment.

In addition to the fifth embodiment, the present embodiment is configured such that, for example, as shown in FIG. 17, like the first embodiment, a verification voltage of 0 V is applied to a word line WL0 (first selection wire) and a word line WL31 (first selection wire), and a verification voltage of 0.5 V (second selection wire voltage or third selection wire voltage) higher than the verification voltage (first selection wire voltage) applied to the word lines WL0 and WL31 is applied to the word lines WL1 to WL30 (second selection wire or third selection wire).

Accordingly, the effective threshold voltage of the first target memory cells MC0 and MC31 relatively further increases with respect to the effective threshold voltage of the second target memory cells MC1 to MC30. In this case, when the first target memory cells MC0 and MC31 receive great inter-cell interference, it is insufficient only to reduce the dummy word line read pass voltages of the dummy word lines DWL1, DLW2 adjacent to the first target memory cells MC0 and MC31. When the dummy word line read pass voltages of the dummy word lines DWL1, DLW2 is reduced too much, the dummy memory cells DC1, DC2 are less likely to become conductive. Accordingly, not only the dummy word line read pass voltages of the dummy word lines DWL1, DLW2 are reduced but also a verification voltage of 0 V lower than the word lines WL1 to WL30 is applied to the word lines WL0 and WL31. As a result, even when great inter-cell interference occurs, the effective threshold voltages of all the memory cells MC0 to MC31 during the erase verification operation can be made substantially the same. As a result, as shown in FIG. 18, the threshold voltages of the memory cells MC0 to MC31 having been subjected to the erase sequence can be made about the same.

Therefore, according to the present embodiment, the same effects as those of the first embodiment can be obtained even when two dummy word lines are provided at each of the both ends of the memory string. In addition, the present embodiment achieves greater effect when the interval between the dummy word line DWL and the word line WL is narrow due to the reduction in the size.

[Seventh Embodiment]

Figure 19:
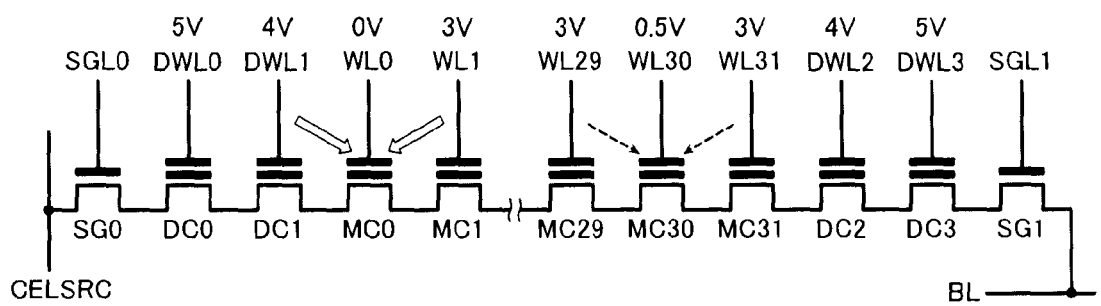
FIG. 19 is a figure illustrating a bias state of a cell array during erase verification operation of a nonvolatile semiconductor storage device according to a seventh embodiment.

The seventh embodiment is a modification of the second, fifth, and sixth embodiments. FIGS. 18 and 19 are figures illustrating a bias state of a cell array 1 during erase verification operation respectively performed on even-numbered pages and odd-numbered pages.

Like the fifth and sixth embodiments, the present embodiment is the same as the second embodiment except that, when the bias state of the memory string is considered, the dummy word line read pass voltage (first dummy wire voltage) applied to the dummy word lines DWL adjacent to the memory string is changed from 5 V to 4 V. The magnitude relationship between the inter-cell interference effect (outline arrows in FIGS. 18 and 19) received by the first target memory cells MC0 and MC31 (first memory cell) and the inter-cell interference effect (arrows of solid lines in FIGS. 18 and 19) received by the second target memory cells MC1 to MC31 (MC1 and MC31 are second memory cells, and MC2 to MC30 are third memory cells) is the same as the second embodiment.

Therefore, the erase verification operation performed on the even-numbered pages according to the present embodiment is the same as the second embodiment in that, for example, as shown in FIG. 19, the verification voltage of 0 V (first selection wire voltage) is applied to the word line WL0, and the verification voltage of 0.5 V (second selection wire voltage or third selection wire voltage) higher than the verification voltage applied to the word line WL0 is applied to the word lines WL2, WL4, . . . , WL30.

Figure 20:
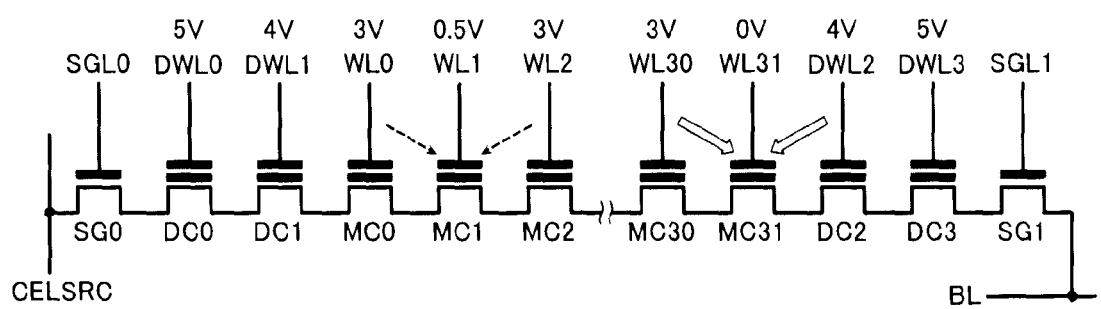
FIG. 20 is a figure illustrating a bias state of a cell array during erase verification operation of the nonvolatile semiconductor storage device according to the embodiment.

In the erase verification operation performed on the odd-numbered pages according to the present embodiment, for example, as shown in FIG. 20, the verification voltage of 0 V (first selection wire voltage) is applied to the word line WL31, and the verification voltage of 0.5 V (second selection wire voltage or third selection wire voltage) higher than the verification voltage applied to the word line WL31 is applied to the word lines WL1, WL3, . . . , WL29.

As a result, when the erase verification operation performed on the even-numbered pages and the erase verification operation performed on the odd-numbered pages are considered together, the effective threshold voltages of all the memory cells MC0 to MC31 during the erase verification operation can be made about the same, and accordingly, like the fifth and sixth embodiment as shown in FIG. 18, the threshold voltages of all the memory cells MC0 to MC31 having been subjected to the erase sequence can be made about the same.

Therefore, according to the present embodiment, the same effects as those of the second embodiment can be obtained even when two dummy word lines are provided at each of the both ends of the memory string.

Like the fifth embodiment, the dummy word line read pass voltage of the dummy word lines adjacent to the memory string is set at a voltage lower than the dummy word line read pass voltage of the dummy word lines adjacent to the selection gate transistors SG, and the verification voltage of 0.5 V is applied to the word lines WL of the memory cells to be subjected to the erase verification.

[Eighth Embodiment]

Figure 21:
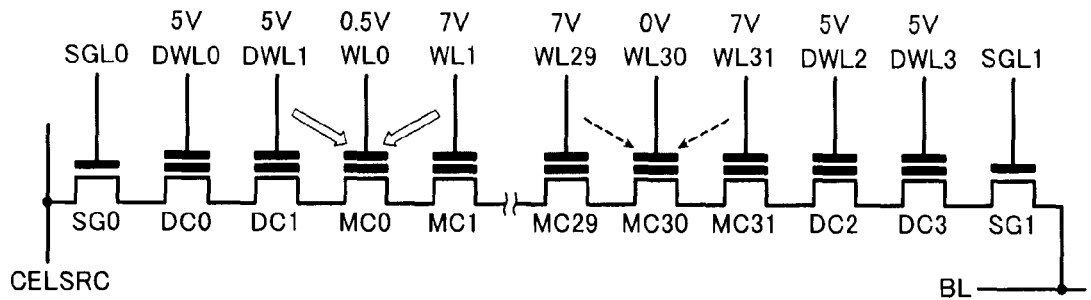
FIG. 21 is a figure illustrating a bias state of a cell array during erase verification operation of a nonvolatile semiconductor storage device according to an eighth embodiment.

The eighth embodiment is a modification of the third embodiment, and FIGS. 20 and 21 are figures illustrating a bias state of a cell array 1 during erase verification operation respectively performed on even-numbered pages and odd-numbered pages.

The present embodiment is the same as the sixth and seventh embodiments in the magnitude relationship between the inter-cell interference effect (outline arrows in FIGS. 20 and 21) received by the first target memory cells MC0 and MC31 (first memory cell) and the inter-cell interference effect (arrows of broken lines in FIGS. 20 and 21) received by the second target memory cells MCi to MC31.

Therefore, in the erase verification operation performed on the even-numbered pages according to the present embodiment is the same as the third embodiment in that, for example, as shown in FIG. 21, the verification voltage of 0.5 V is applied to the word line WL0, and the verification voltage of 0 V lower than the verification voltage applied to the word line WL0 is applied to the word lines WL2, WL4, . . . , WL30. Further, the same dummy word line read pass voltage (5 V) as that applied to the dummy word lines DWL0, DWL3 is applied to the dummy word lines DWL1, DWL2. This is because smaller potential difference between the dummy word line read pass voltage and the read pass voltage results in more uniform threshold voltages of all the memory cells MC0 to MC31 having been subjected to the erase sequence.

Figure 22:
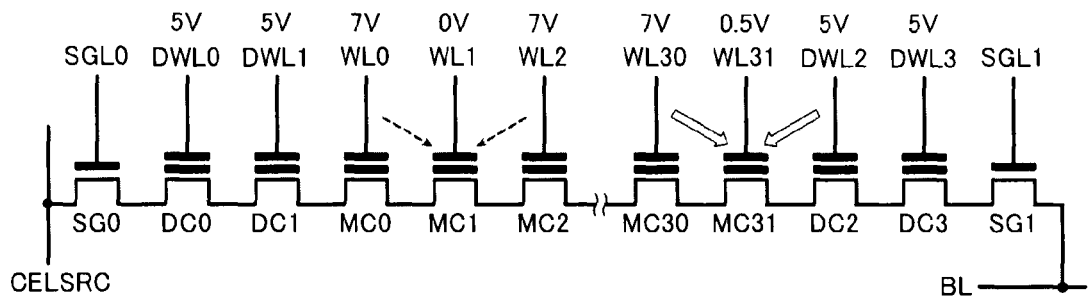
FIG. 22 is a figure illustrating a bias state of a cell array during erase verification operation illustrating the nonvolatile semiconductor storage device according to the embodiment.

The erase verification operation performed on the odd-numbered pages according to the present embodiment is the same as the third embodiment in that, for example, as shown in FIG. 22, the verification voltage of 0.5 V is applied to the word line WL31, and the verification voltage of 0 V lower than the verification voltage applied to the word line WL31 is applied to the word lines WL1, WL3, . . . , WL29.

As a result, when the erase verification operation performed on the even-numbered pages and the erase verification operation performed on the odd-numbered pages are considered together, the effective threshold voltages of all the memory cells MC0 to MC31 during the erase verification operation can be made about the same, and accordingly, like the fifth and sixth embodiment as shown in FIG. 18, the threshold voltages of all the memory cells MC0 to MC31 having been subjected to the erase sequence can be made about the same.

Therefore, according to the present embodiment, the same effects as those of the third embodiment can be obtained even when two dummy word lines are provided at each of the both ends of the memory string.

[Ninth Embodiment]

The first to eighth embodiment are embodiments relating to the NAND-type flash memory in which the dummy word lines DWL are provided at both ends of the memory string. In contrast, the ninth to eleventh embodiments are embodiments relating to a NAND-type flash memory in which no dummy word line DWL is provided at both ends of the memory string.

The ninth embodiment is a modification of the first or sixth embodiment.

First, structure and erase sequence of a NAND cell unit 4 according to a comparative example will be explained as a background for explaining the present embodiment.

Figure 47:
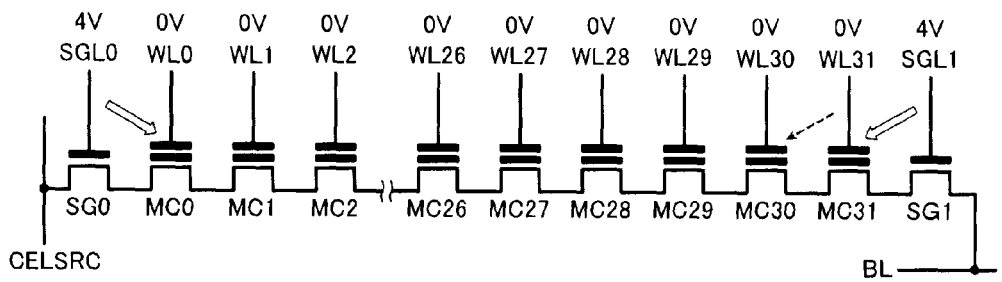
FIG. 47 is a figure illustrating a bias state of a cell array during erase verification operation of a nonvolatile semiconductor storage device according to a comparative example of the ninth embodiment.

In the case of the present NAND cell unit 4 according to the comparative example, as shown in FIG. 47, a selection gate transistor SG0 is directly connected to a memory cell MC0, and a selection gate transistor SG1 is directly connected to a memory cell MC31.

In addition, in the erase verification operation according to the present comparative example, as shown in FIG. 47, a selection gate voltage (gate wire voltage), which is about a level for bringing selection gate transistors SG0 and SG1 into conduction, (4 V in the case of FIG. 47) is applied to selection gate lines SGL0 and SGL1 (gate wires), and a verification voltage of 0 V is applied to word lines WL0 to WL31.

Figure 48:
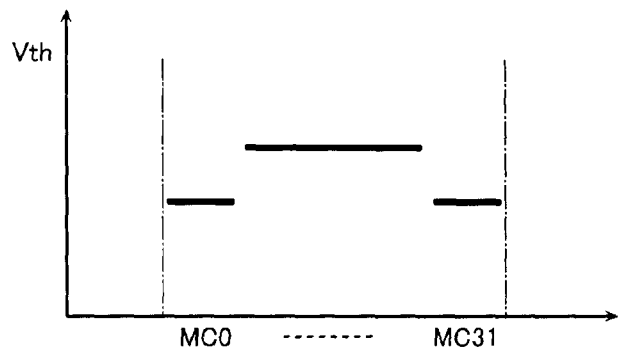
FIG. 48 is a figure illustrating an effective threshold voltage of a memory cell during erase verification operation of the nonvolatile semiconductor storage device according to the comparative example.

In this case, the inter-cell interference (outline arrows in FIG. 47) received by the first target memory cells MC0 and MC31 is greater than the inter-cell interference (arrows of broken lines in FIG. 44) received by the second target memory cells MC1 to MC30. Accordingly, the effective threshold voltage of the first target memory cells MC0 and MC31 during the erase verification operation appears to be lower than the effective threshold voltage of the second target memory cells MC1 to MC30 as shown in FIG. 48. As a result, the threshold voltages of the first target memory cells MC0 and MC31 having been subjected to the erase sequence are higher than the threshold voltage of the erased state as shown by broken lines in FIG. 49.

Figure 23:
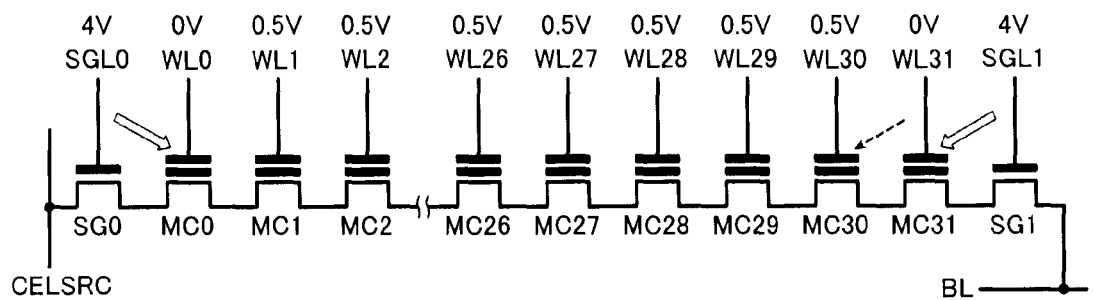
FIG. 23 is a figure illustrating a bias state of a cell array during erase verification operation of a nonvolatile semiconductor storage device according to a ninth embodiment.

Accordingly, the erase verification operation according to the present embodiment is the same as the first embodiment in that, for example, as shown in FIG. 23, a verification voltage of 0 V (first selection wire voltage) is applied to the word lines WL0 and WL31, and a verification voltage of 0.5 V (second selection wire voltage or third selection wire voltage) higher than the verification voltage applied to the word lines WL0 and WL31 is applied to the word lines WL1 to WL30.

Figure 24:
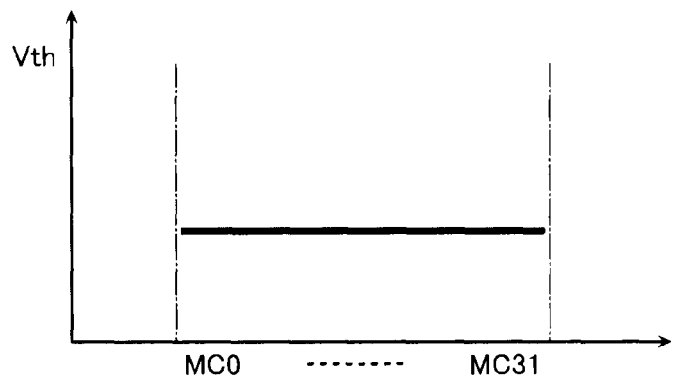
FIG. 24 is a figure illustrating a threshold voltage of a memory cell after erase sequence of the nonvolatile semiconductor storage device according to the embodiment.

Accordingly, the effective threshold voltage of the first target memory cells MC0 and MC31 (first memory cells) relatively increases with respect to the effective threshold voltage of the second target memory cells MC1 to MC30 (second memory cells or third memory cells), and the effective threshold voltages of all the memory cells MC0 to MC31 during the erase verification operation can be made about the same. As a result, as shown in FIG. 24, the threshold voltages of the memory cells MC0 to MC31 having been subjected to the erase sequence can be made about the same.

Therefore, according to the present embodiment, the same effects as those of the first or sixth embodiment can be obtained even when no dummy word line is provided at both ends of the memory string.

Figure 25:
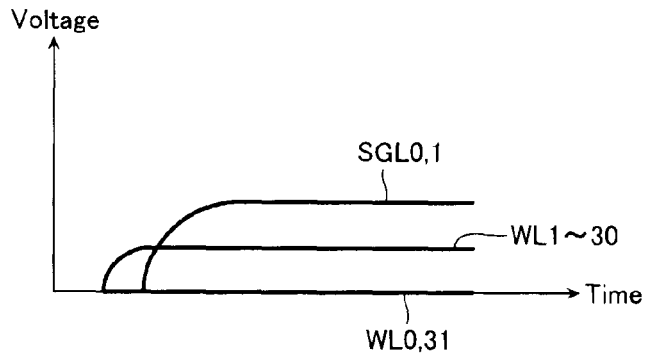
FIG. 25 is a figure illustrating one of a voltage diagram of erase verification according to the embodiment.

Application of the dummy word line read pass voltage to the dummy word lines DWL and application of the verification voltage to the word lines WL are performed at substantially the same time. On the other hand, application of the selection gate voltage to the selection gate lines SG and application of the verification voltage to the word lines WL are performed at different times (FIG. 25). Accordingly, when there is no dummy word line DWL, the voltage of the word line WL adjacent to the selection gate line SG may change due to change of the voltage of the selection gate line SG. For example, after the verification voltage is applied to the word lines WL, and the selection gate voltage is applied to the selection gate lines SG, the voltages of the word lines WL adjacent to the selection gate lines SG may increase.

Even in such case, by setting the voltage of a word line WL adjacent to a selection gate line SG at a voltage lower than the voltage of another word line WL, the effective threshold voltages of all the memory cells MC0 to MC31 during the erase verification operation can be made the same more precisely.

[Tenth Embodiment]

The tenth embodiment is a modification of the second or seventh embodiment.

First, erase sequence according to the comparative example will be explained as a background for explaining the present embodiment.

Figure 50:
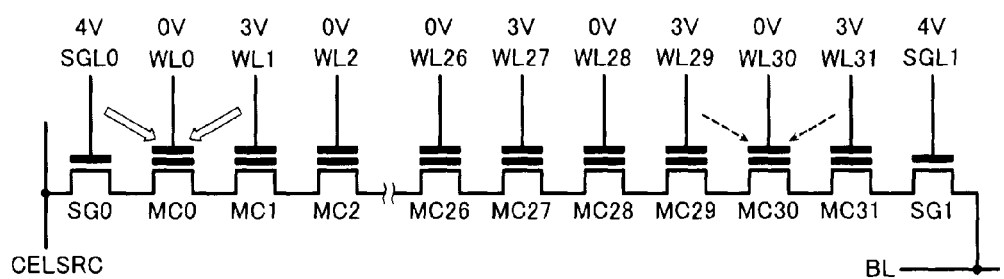
FIG. 50 is a figure illustrating a bias state of a cell array during erase verification operation of a nonvolatile semiconductor storage device according to a comparative example of the tenth embodiment.

In the erase verification operation performed on even-numbered pages according to the present comparative example, as shown in FIG. 50, a selection gate voltage (gate wire voltage, 4 V in the case of FIG. 47) is applied to selection gate lines SGL0 and SGL1 (gate wires), a verification voltage (0 V in the case of FIG. 47) is applied to even-numbered word lines WLe, and a read pass voltage (3 V in the case of FIG. 47) less than the selection gate voltage is applied to odd-numbered word lines WLo.

In this case, the inter-cell interference effect received by the first target memory cell MC0 (outline arrows in FIG. 50) is greater than the inter-cell interference effect received by the second target memory cells MC2, MC4, . . . , MC30 (arrows of broken lines in FIG. 47).

Figure 51:
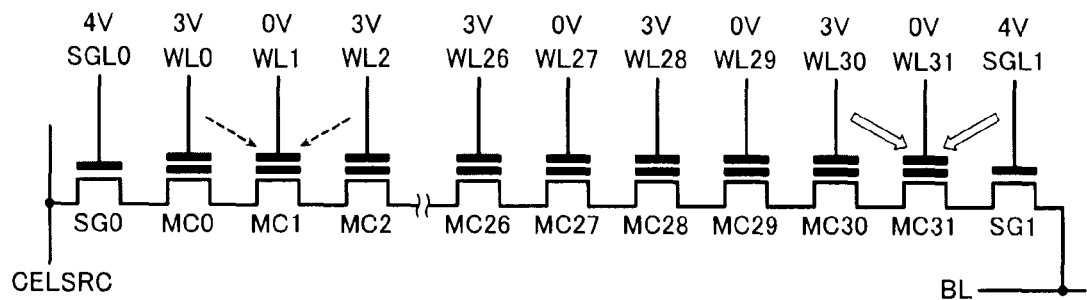
FIG. 51 is a figure illustrating a bias state of a cell array during erase verification operation of the nonvolatile semiconductor storage device according to the comparative example.

In the erase verification operation performed on odd-numbered pages according to the present comparative example, as shown in FIG. 51, a selection gate voltage (4 V in the case of FIG. 51) is applied to the selection gate lines SGL0 and SGL1, a verification voltage (0 V in the case of FIG. 51) is applied to the odd-numbered word lines WLo, and a read pass voltage (3 V in the case of FIG. 51) lower than the selection gate voltage is applied to the even-numbered word lines WLe.

In this case, the inter-cell interference (outline arrows in FIG. 51) received by the first target memory cell MC31 is greater than the inter-cell interference (arrows of broken lines in FIG. 51) received by the second target memory cells MC2, MC4, . . . , MC30.

Figure 49:
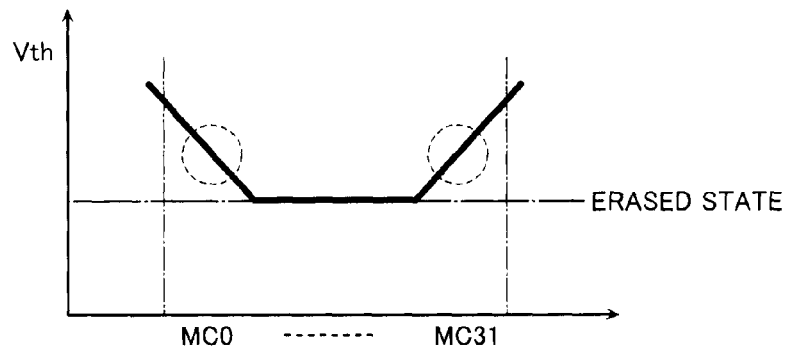
FIG. 49 is a figure illustrating a threshold voltage of a memory cell after erase sequence of the nonvolatile semiconductor storage device according to the comparative example.

Accordingly, when the erase verification operation performed on the even-numbered pages and the erase verification operation performed on the odd-numbered pages are considered together, the effective threshold voltage of the first target memory cells MC0 and MC31 appears to be less than the effective threshold voltage of the second target memory cells MC1 to MC31 like the ninth embodiment as shown in FIG. 48. As a result, the threshold voltages of the first target memory cells MC0 and MC31 having been subjected to the erase sequence also are higher than the threshold voltage of the erased state like the comparative example of the ninth embodiment as shown in FIG. 49.

Figure 26:
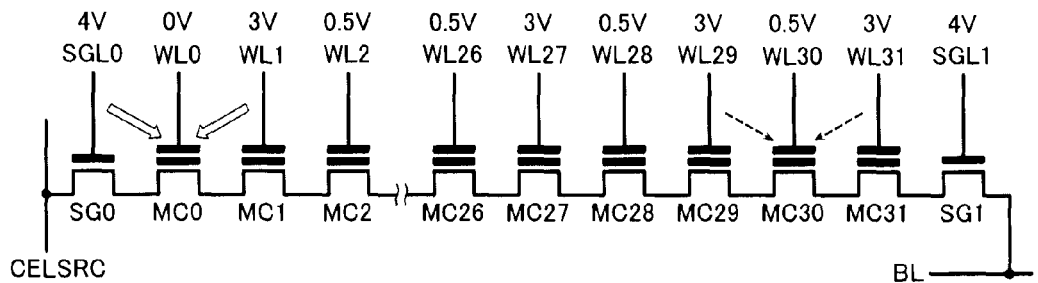
FIG. 26 is a figure illustrating a bias state of a cell array during erase verification operation of a nonvolatile semiconductor storage device according to a tenth embodiment.

Accordingly, the erase verification operation performed on the even-numbered pages according to the present embodiment is the same as the second or seventh embodiment in that, for example, as shown in FIG. 26, the verification voltage of 0 V (first selection wire voltage) is applied to the word line WL0, and the verification voltage of 0.5 V (second selection wire voltage or third selection wire voltage) higher than the verification voltage applied to the word line WL0 is applied to the word lines WL2, WL4, . . . , WL30.

Figure 27:
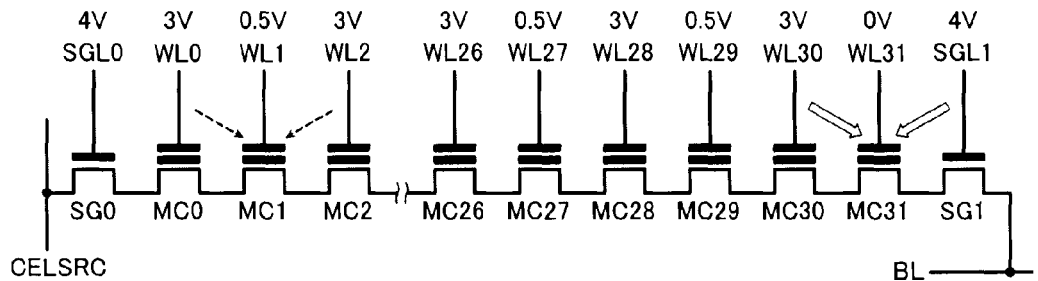
FIG. 27 is a figure illustrating a bias state of a cell array during erase verification operation of the nonvolatile semiconductor storage device according to the embodiment.

The erase verification operation performed on the odd-numbered pages according to the present embodiment is the same as the second or seventh embodiment in that, for example, as shown in FIG. 27, the verification voltage of 0 V (first selection wire voltage) is applied to the word line WL31, and the verification voltage of 0.5 V (second selection wire voltage or third selection wire voltage) higher than the verification voltage applied to the word line WL31 is applied to the word lines WL1, WL3, . . . , WL29.

Accordingly, when the erase verification operation performed on the even-numbered pages and the erase verification operation performed on the odd-numbered pages are considered together, the effective threshold voltages of all the memory cells MC0 to MC31 during the erase verification sequence can be made about the same. As a result, like the ninth embodiment as shown in FIG. 24, the threshold voltages of the memory cells MC0 to MC31 having been subjected to the erase sequence can be made about the same.

Therefore, according to the present embodiment, the same effects as those of the second, seven or ninth embodiment can be obtained even when no dummy word line is provided at both ends of the memory string.

[Eleventh Embodiment]

The eleventh embodiment is a modification of the third or eighth embodiment.

First, erase sequence according to the comparative example will be explained as a background for explaining the present embodiment.

Figure 52:
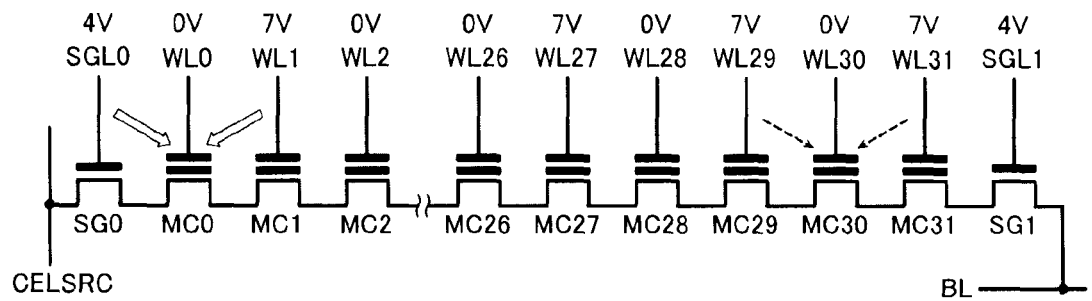
FIG. 52 is a figure illustrating a bias state of a cell array during erase verification operation of a nonvolatile semiconductor storage device according to a comparative example of the eleventh embodiment.

In the erase verification operation performed on even-numbered pages according to the present comparative example, as shown in FIG. 52, a selection gate voltage (4 V in the case of FIG. 52) is applied to selection gate lines SGL0 and SGL1 (third wires), a verification voltage (0 V in the case of FIG. 52) is applied to even-numbered word lines WLe, and a read pass voltage (7 V in the case of FIG. 52) is applied to odd-numbered word lines WLo.

In this case, in contrast to the tenth embodiment, the inter-cell interference effect received by the first target memory cell MC0 (outline arrows in FIG. 52) is greater than the inter-cell interference effect received by the second target memory cells MC2, MC4, . . . , MC30 (arrows of broken lines in FIG. 52).

Figure 53:
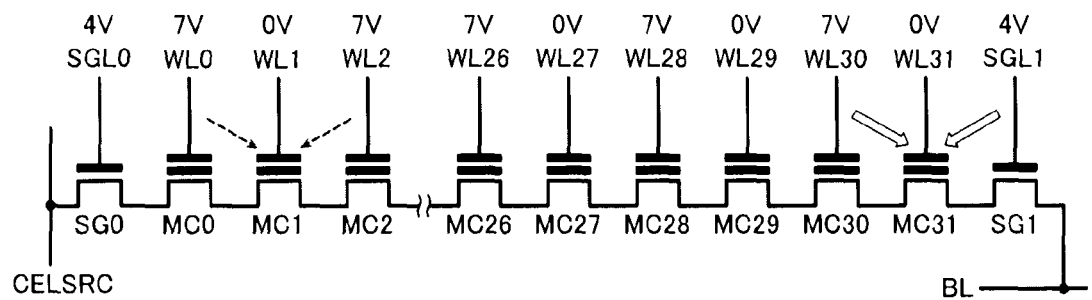
FIG. 53 is a figure illustrating a bias state of a cell array during erase verification operation of the nonvolatile semiconductor storage device according to the comparative example.

In the erase verification operation performed on odd-numbered pages according to the present comparative example, as shown in FIG. 53, a selection gate voltage (4 V in the case of FIG. 53) is applied to the selection gate lines SGL0 and SGL1, a verification voltage (0 V in the case of FIG. 53) is applied to the odd-numbered word lines WLo, and a read pass voltage (7 V in the case of FIG. 53) is applied to the even-numbered word lines WLe.

In this case, in contrast to the tenth embodiment, the inter-cell interference effect received by the first target memory cell MC31 (outline arrows in FIG. 53) is less than the inter-cell interference effect received by the second target memory cells MC1, MC3, . . . , MC29 (arrows of broken lines in FIG. 53).

Figure 54:
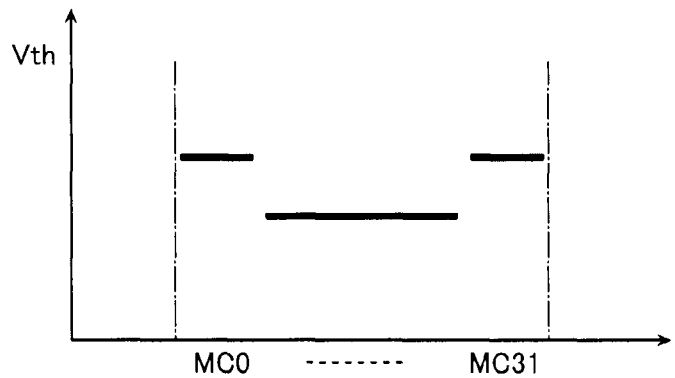
FIG. 54 is a figure illustrating an effective threshold voltage of a memory cell during erase verification operation of the nonvolatile semiconductor storage device according to the comparative example.
Figure 55:
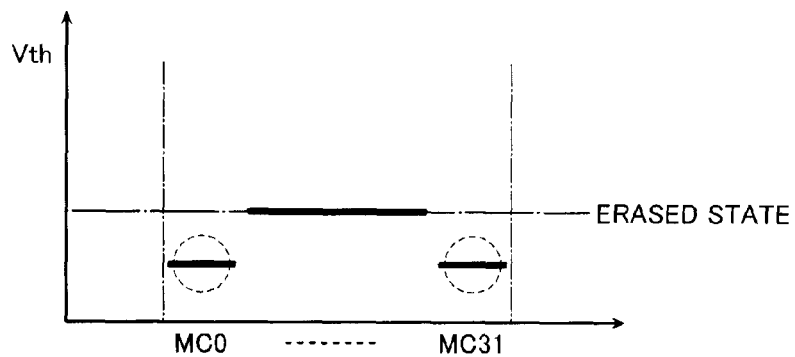
FIG. 55 is a figure illustrating a threshold voltage of a memory cell after erase sequence of the nonvolatile semiconductor storage device according to the comparative example.

Accordingly, when the erase verification operation performed on the even-numbered pages and the erase verification operation performed on the odd-numbered pages are considered together, the effective threshold voltage of the first target memory cells MC0 and MC31 appears to be higher than the effective threshold voltage of the second target memory cells MC1 to MC31 as shown in FIG. 54. As a result, the threshold voltage of the first target memory cells MC0 and MC31 having been subjected to the erase sequence is deeper than the threshold voltage of the erased state, and this results in over-erase state as shown by circles of broken lines in FIG. 55.

Figure 28:
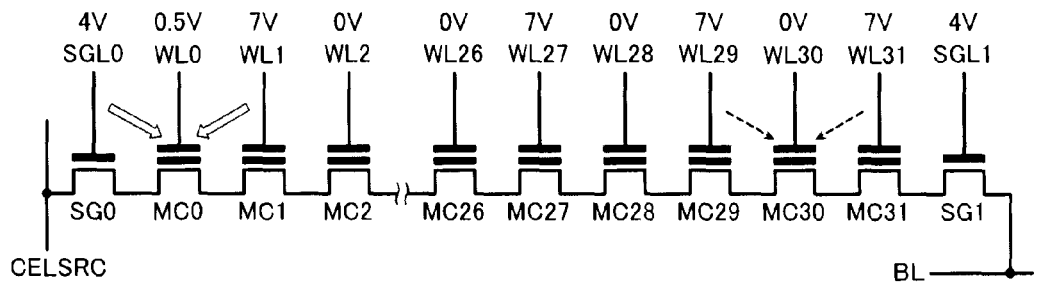
FIG. 28 is a figure illustrating a bias state of a cell array during erase verification operation of a nonvolatile semiconductor storage device according to an eleventh embodiment.

Accordingly, the erase verification operation performed on the even-numbered pages according to the present embodiment is the same as the third or eighth embodiment in that, for example, as shown in FIG. 28, the verification voltage of 0.5 V is applied to the word line WL0, and the verification voltage of 0 V lower than the verification voltage applied to the word line WL0 is applied to the word lines WL2, WL4, . . . , WL30.

Figure 29:
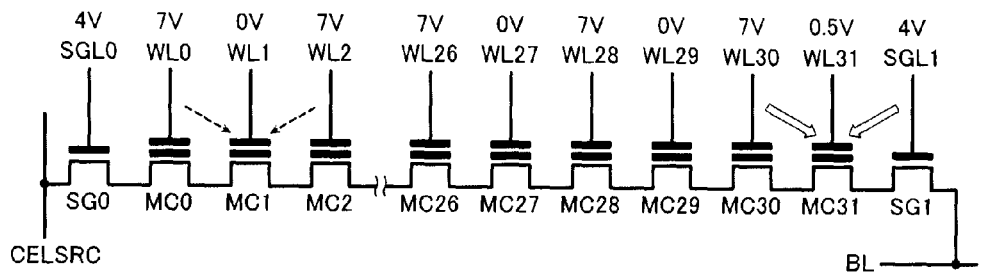
FIG. 29 is a figure illustrating a bias state of a cell array during erase verification operation of the nonvolatile semiconductor storage device according to the embodiment.

The erase verification operation performed on the odd-numbered pages according to the present embodiment is the same as the third or eighth embodiment in that, for example, as shown in FIG. 29, the verification voltage of 0.5 V is applied to the word line WL31, and the verification voltage of 0 V less than the verification voltage applied to the word line WL31 is applied to the word lines WL1, WL3, . . . , WL29.

Accordingly, when the erase verification operation performed on the even-numbered pages and the erase verification operation performed on the odd-numbered pages are considered together, the effective threshold voltages of all the memory cells MC0 to MC31 during the erase verification operation can be made about the same, and as a result, like the ninth embodiment as shown in FIG. 24, the threshold voltages of all the memory cells MC0 to MC31 having been subjected to the erase sequence can be made about the same.

Therefore, according to the present embodiment, the same effects as those of the third, eighth or ninth embodiment can be obtained even when no dummy word line is provided at both ends of the memory string.

[Twelfth Embodiment]

The twelfth to fourteenth embodiment is obtained by improving the erase operation according to the first to third embodiments. Therefore, in the twelfth to fourteenth embodiments, the erase operation will be mainly explained.

A comparative example of the present embodiment will be explained as a background for explaining the twelfth embodiment.

Figure 56:
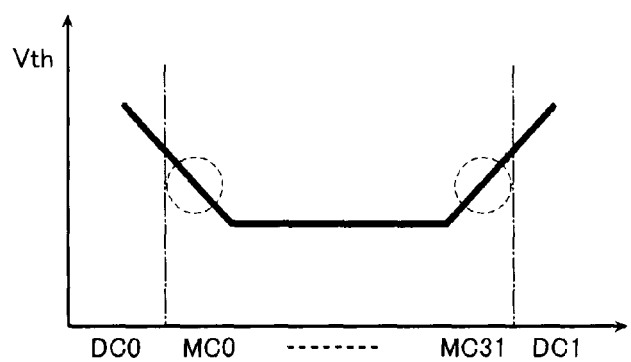
FIG. 56 is a figure illustrating a threshold voltage of a memory cell after erase operation of a nonvolatile semiconductor storage device according to a comparative example of the twelfth embodiment.
Figure 57:
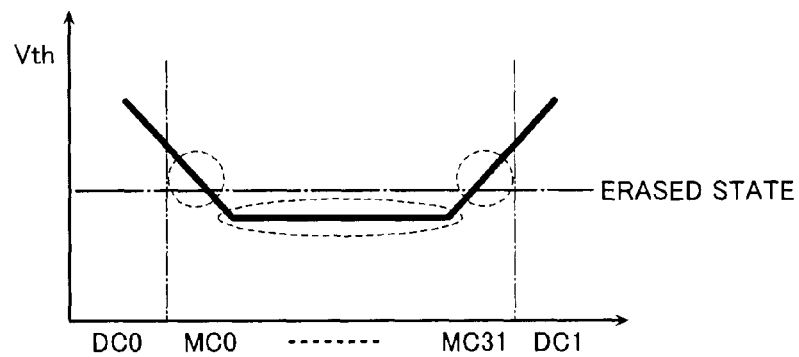
FIG. 57 is a figure illustrating a threshold voltage of a memory cell after erase sequence of the nonvolatile semiconductor storage device according to the comparative example.

The erase sequence of the present comparative example is the same as that of the comparative example of the first embodiment. Therefore, the bias state of a cell array 1 during the erase operation is the same as that of the first embodiment as shown in FIG. 36. In this case, the first target memory cells MC0 and MC31 are affected by the stress-relaxing voltage of 1 V applied to the dummy word lines DWL0 and DWL1, and it is difficult to erase the first target memory cells MC0 and MC31. As a result, the threshold voltages of the first target memory cells MC0 and MC31 having been subjected to the erase operation are higher than the threshold voltages of the second target memory cells MC1 to MC30 as indicated by circles of broken lines in FIG. 56. On the other hand, the erase verification operation is the same as the comparative example of the first embodiment in that the effective threshold voltages of the first target memory cells MC0 and MC31 appears to be lower than the effective threshold voltages of the second target memory cells MC1 to MC30. Accordingly, according to the erase sequence of the present comparative example, the threshold voltages of the first target memory cells MC0 and MC31 easily become higher than the threshold voltage of the erased state as indicated by circles of broken lines in FIG. 57, and on the contrary, the threshold voltages of the second target memory cells MC1 to MC30 easily become lower than the threshold voltage of the erased state as indicated by an ellipse of a broken line in FIG. 57.

Figure 30:
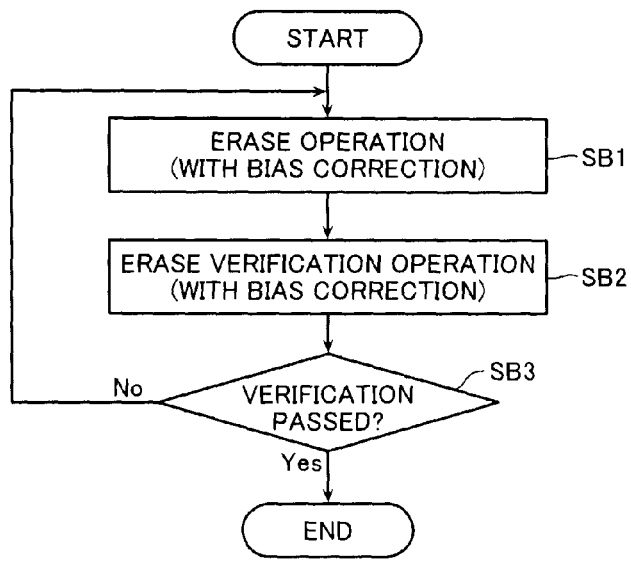
FIG. 30 is a figure illustrating a flow of erase sequence of a nonvolatile semiconductor storage device according to a twelfth embodiment.

Accordingly, in the present embodiment, the erase sequence as shown in FIG. 30 is executed.

Steps SB1 to SB3 as shown in FIG. 30 correspond to steps S11 to S13 as shown in FIG. 4, respectively. However, in the explanation below, step SB1, i.e., a step different from the first embodiment, will be explained. Explanation about the other steps similar to those of the first embodiment is omitted.

Figure 31:
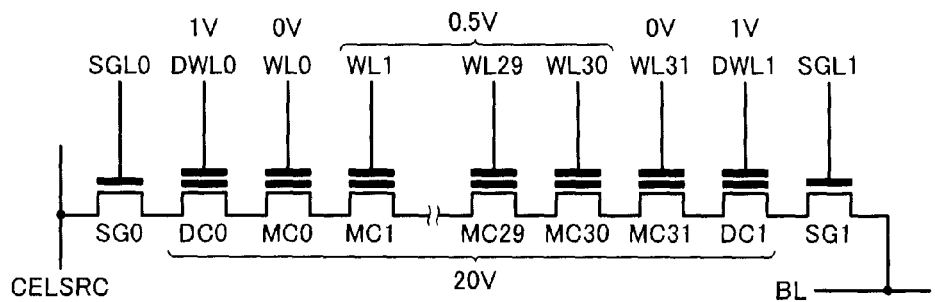
FIG. 31 is a figure illustrating of a bias state of a cell array during erase operation of the nonvolatile semiconductor storage device according to the embodiment.

In the erase operation according to the present embodiment, for example, as shown in FIG. 31, a voltage of 0 V (first selection wire voltage) is applied to word lines WL0 and WL31, and a voltage of 0.5 V (second selection wire voltage or third selection wire voltage) is applied to word lines WL1 to WL31. As described above, a voltage higher than the voltage applied to the word lines WL0 and WL31 is applied to the word lines WL1 to WL30, so that the same influence given by the stress-relaxing voltage to the first target memory cells MC0 and MC31 (first memory cells) can be given to the second target memory cells MC1 to MC30 (second memory cell or third memory cell), and further, the threshold voltages of all the memory cells MC0 to MC31 having been subjected to the erase operation can be made uniform.

Figure 32:
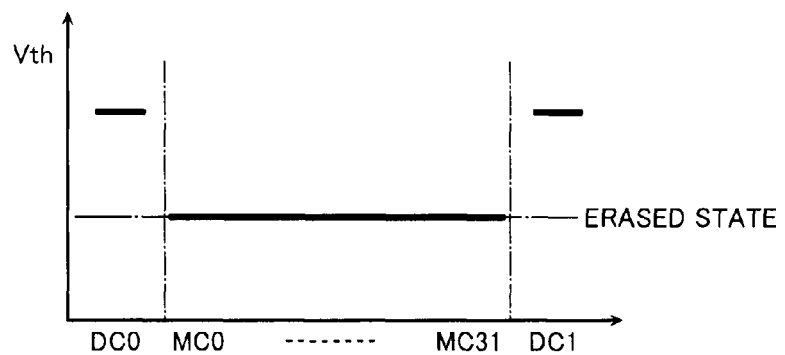
FIG. 32 is a figure illustrating a threshold voltage of a memory cell after erase sequence of the nonvolatile semiconductor storage device according to the embodiment.

Further, in step SB2, the same erase verification operation as that of the first embodiment is executed, so that the effect of uniformizing the threshold voltages of the memory cells MC0 to MC31 can be further improved. Like the comparative example according to the first embodiment, the comparative example of the present embodiment is configured such that the erase verification is passed even in a state where the threshold voltage of the memory cells MC0 and MC31 is higher than the erased state, and this occurs to an insufficient erase state of the memory cells MC0 and MC31. With regard to that point, the present embodiment is configured to prevent the memory cells from attaining an insufficient erase state or from attaining an over-erase state after the erase sequence, and as shown in FIG. 32, uniform threshold voltages can be obtained for all the memory cells MC0 to MC31.

As described above, according to the present embodiment, the threshold voltages of the memory cells having been subjected to the erase operation can be made about the same, and therefore, as compared with the first embodiment, the NAND-type flash memory with higher degree of precision in the erase sequence can be provided.

[Modification of Thirteenth Embodiment]

The thirteenth embodiment is a modification of the twelfth embodiment, and is different from the twelfth embodiment in that two dummy word lines DWL are provided at one side of the memory string.

First, erase sequence according to a comparative example of the present embodiment (hereinafter referred to as "the present comparative example") will be explained as a background for explaining the erase sequence of the NAND-type flash memory cell according to the present embodiment.

Figure 58:
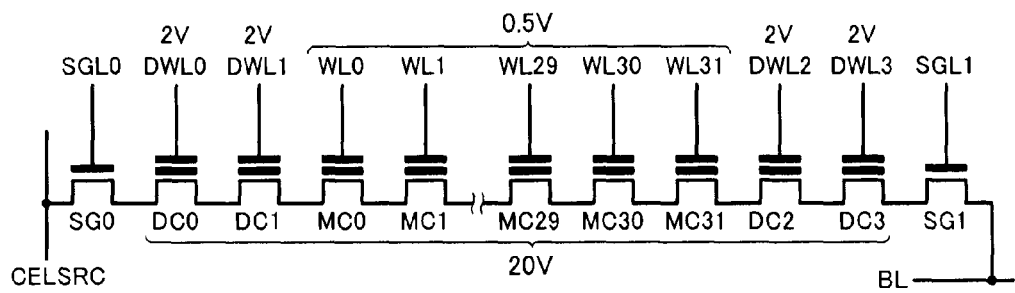
FIG. 58 is a figure illustrating a bias state of a cell array after erase operation of a nonvolatile semiconductor storage device according to a comparative example of the thirteenth embodiment.

FIG. 58 is a figure illustrating a bias state of a cell array 1 during erase operation according to the present comparative example. In the case of the present comparative example, the first target memory cells MC0 and MC31 are affected by the stress-relaxing voltage of 2 V applied to the dummy word lines DWL1 and DWL2, and it is difficult to erase the first target memory cells MC0 and MC31. As a result, the threshold voltages of the first target memory cells MC0 and MC31 having been subjected to the erase operation are higher than the threshold voltages of the second target memory cells MC1 to MC30. On the other hand, in the erase verification operation, the effective threshold voltage of the first target memory cells MC0 and MC31 appears to be lower than the effective threshold voltage of the second target memory cells MC1 to MC30. Accordingly, according to the erase sequence of the present comparative example, the threshold voltages of the first target memory cells MC0 and MC31 easily become higher than the threshold voltage of the erased state, and on the contrary, the threshold voltages of the second target memory cells MC1 to MC30 easily become deeper than the threshold voltage of the erased state.

Figure 33:
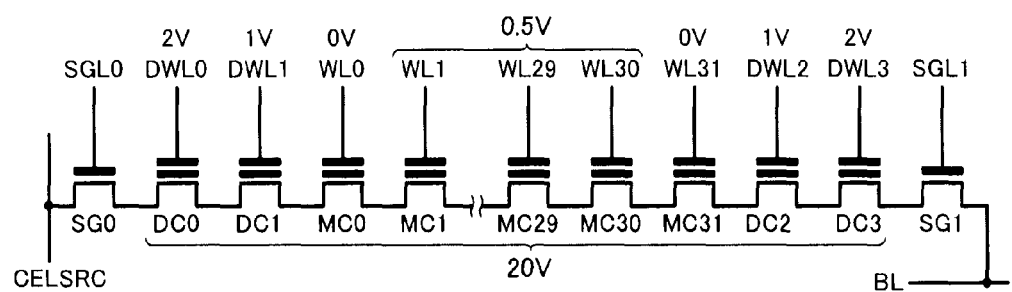
FIG. 33 is a figure illustrating of a bias state of a cell array during erase operation of a nonvolatile semiconductor storage device according to a thirteenth embodiment.

In the erase operation of the present embodiment, for example, as shown in FIG. 33, a voltage of 2 V (second dummy wire voltage) is applied to the dummy word lines DWL0 and DWL3, and a voltage of 1 V (first dummy wire voltage) is applied to the dummy word lines DWL1 and DWL2. In this case, like the twelfth embodiment, a voltage of 0 V (first selection wire voltage) is applied to word lines WL0 and WL31, and a voltage of 0.5 V (second selection wire voltage or third selection wire voltage) is applied to word lines WL1 to WL31. As described above, a voltage higher than the voltage applied to the word lines WL0 and WL31 is applied to the word lines WL1 to WL30, so that the same influence given by the stress-relaxing voltage to the first target memory cells MC0 and MC31 can be given to the second target memory cells MC1 to MC30, and further, the threshold voltages of all the memory cells MC0 to MC31 having been subjected to the erase operation can be made uniform.

Further, in step SB2, the same erase verification operation as that of the fifth embodiment is executed, so that the effect of uniformizing the threshold voltages of the memory cells MC0 to MC31 can be further improved. Like the comparative example according to the fifth embodiment, the comparative example of the present embodiment is configured such that the erase verification is passed even in a state where the threshold voltage of the memory cells MC0 and MC31 is higher than the erased state, and this occurs to an insufficient erase state of the memory cells MC0 and MC31. With regard to that point, the present embodiment is configured to prevent the memory cells from attaining an insufficient erase state or from attaining an over-erase state after the erase sequence, and as shown in FIG. 32, uniform threshold voltages can be obtained for all the memory cells MC0 to MC31.

[Fourteenth Embodiment]

The fourteenth embodiment is a modification of the second embodiment.

Figure 34:
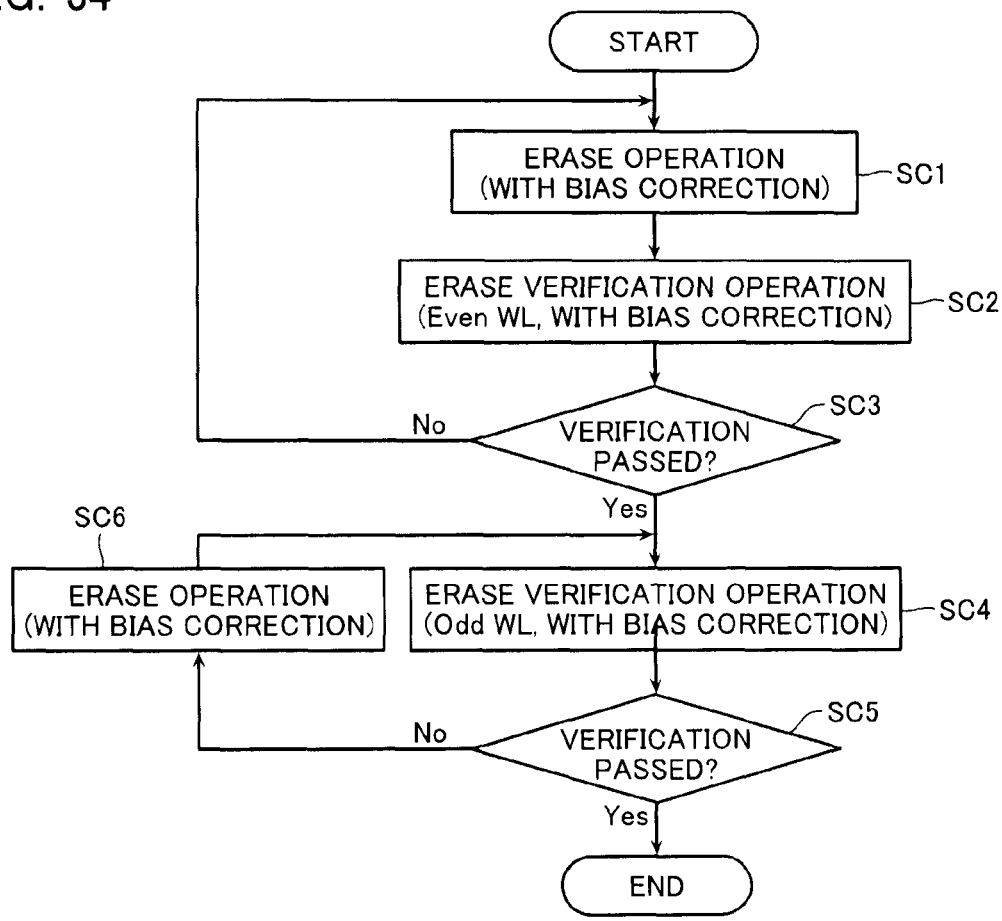
FIG. 34 is a figure illustrating a flow of erase sequence of a nonvolatile semiconductor storage device according to a fourteenth embodiment.

FIG. 34 is a figure illustrating a flow of erase sequence according to the present embodiment.

Steps SC1 to SC6 as shown in FIG. 34 correspond to steps S21 to S26 as shown in FIG. 7. However, the erase operation according to the second embodiment has the same phenomenon as that explained with reference to FIGS. 34, 54, and 55.

Accordingly, in the present embodiment, the same erase operation as that of the twelfth embodiment is executed in step SC1.

Accordingly, according to the present embodiment, the NAND-type flash memory with higher degree of precision in the erase sequence can be provided as compared with the second embodiment.

[Fifteenth Embodiment]

The fifteenth embodiment is a modification of the third embodiment. In the fifteenth embodiment, a flow of erase sequence is the same as that of the fourteenth embodiment as shown in FIG. 34.

In the present embodiment, the same erase operation as that of the twelfth embodiment is executed instead of the erase operation of the third embodiment.

Accordingly, according to the present embodiment, the NAND-type flash memory with higher degree of precision in the erase sequence can be provided as compared with the third embodiment.

[Others]

While certain embodiments have been described, these embodiments have been presented by way of example only, and are not intended to limit the scope of the inventions. Indeed, the novel methods and systems described herein may be embodied in a variety of other forms: furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A nonvolatile semiconductor storage device comprising:
a cell array including a cell unit, a selection wire and a dummy wire, the cell unit including a memory string in which a plurality of memory cells for storing data are connected in series and one or more dummy cells being provided at one end of the memory string, the selection wire connecting to each of the memory cells, and the dummy wire connecting to each of the dummy cells; and
a drive circuit applying voltages to the selection wire and the dummy wire during erase operation for erasing data in the memory cells,
the dummy cell adjacent to the memory string being defined as a first dummy cell, the memory cell adjacent to the first dummy cell being defined as a first memory cell, the memory cell adjacent to the first memory cell being defined as a second memory cell, a voltage applied to the dummy wire connected to the first dummy cell being defined as a first dummy wire voltage, a voltage applied to the selection wire connected to the first memory cell being defined as a first selection wire voltage, and a voltage applied to the selection wire connected to the second memory cell being defined as a second selection wire voltage, and when the second selection wire voltage is lower than the first dummy wire voltage in the erase operation, the drive circuit controlling the voltages so that a difference between the first dummy wire voltage and the second selection wire voltage is less than a difference between the first dummy wire voltage and the first selection wire voltage.

2. The nonvolatile semiconductor storage device according to claim 1, wherein the drive circuit executes erase verification operation to confirm erasing of data in the memory cells, and when the second selection wire voltage is lower than the first dummy wire voltage in the erase verification operation, the drive circuit controls the voltages so that the difference between the first dummy wire voltage and the second selection wire voltage is less than the difference between the first dummy wire voltage and the first selection wire voltage.

3. The nonvolatile semiconductor storage device according to claim 2, wherein the memory cells of the memory string that are connected to odd-numbered points or even-numbered points are adopted as targets of the erase verification operation.

4. The nonvolatile semiconductor storage device according to claim 1, wherein the cell array includes two or more dummy cells which are provided at one end of the memory string and are connected in series.

5. The nonvolatile semiconductor storage device according to claim 4, wherein a voltage applied to the dummy wire connected to the dummy cell adjacent to the first dummy cell is defined as a second dummy wire voltage, and the drive circuit controls the voltages so that the first dummy wire voltage is lower than the second dummy wire voltage in the erase operation.

6. The nonvolatile semiconductor storage device according to claim 3, wherein a memory cell of the memory string connected at one of an odd-numbered point and an even-numbered point is defined as a first target cell, and a memory cell of the memory string connected at the other of the odd-numbered point and the even-numbered point is defined as a second target cell, and the drive circuit repeatedly executes the erase operation and the erase verification operation for the first target cell until the erase verification operation is passed, and thereafter repeatedly executes the erase verification operation for the second target cell along with the erase operation until the erase verification operation is passed.

7. The nonvolatile semiconductor storage device according to claim 1, wherein the memory string includes the first memory cell, the second memory cell, and a third memory cell being the other memory cell, a voltage applied to the selection wire connected to the third memory cell is defined as a third selection wire voltage, and the drive circuit controls the voltages so that the third selection wire voltage is the same as the second wire selection voltage in the erase operation.

8. A nonvolatile semiconductor storage device comprising:

a cell array including a cell unit, a selection wire and a dummy wire, the cell unit including a memory string in which a plurality of memory cells for storing data are connected in series and one or more dummy cells being provided at one end of the memory string, the selection wire connecting to each of the memory cells, and the dummy wire connecting to each of the dummy cells; and a drive circuit for applying voltages to the selection wire and the dummy wire during erase verification operation for confirming erasing of data in the memory cells, the dummy cell adjacent to the memory string being defined as a first dummy cell, the memory cell adjacent to the first dummy cell being defined as a first memory cell, the memory cell adjacent to the first memory cell being defined as a second memory cell, a voltage applied to the dummy wire connected to the first dummy cell being defined as a first dummy wire voltage, a voltage applied to the selection wire connected to the first memory cell being defined as a first selection wire voltage, and a voltage applied to the selection wire connected to the second memory cell being defined as a second selection wire voltage, and when the second selection wire voltage is lower than the first dummy wire voltage in the erase verification operation, the drive circuit controlling the voltages so that a difference between the first dummy wire voltage and the second selection wire voltage is less than a difference between the first dummy wire voltage and the first selection wire voltage.

9. The nonvolatile semiconductor storage device according to claim 8, wherein the memory cells of the memory string that are connected to odd-numbered points or even-numbered points are adopted as targets of the erase verification operation.

10. The nonvolatile semiconductor storage device according to claim 8, wherein the cell array includes two or more dummy cells which are provided at one end of the memory string and are connected in series.

11. The nonvolatile semiconductor storage device according to claim 10, wherein a voltage applied to the dummy wire connected to the dummy cell adjacent to the first dummy cell is defined as a second dummy wire voltage, and the drive circuit controls the voltages the first dummy wire voltage is lower than the second dummy wire voltage in the erase verification operation.

12. The nonvolatile semiconductor storage device according to claim 9, wherein a memory cell of the memory string connected at one of an odd-numbered point and an even-numbered point is defined as a first target cell, and a memory cell of the memory string connected at the other of the odd-numbered point and the even-numbered point is defined as a second target cell, and the drive circuit repeatedly executes the erase operation for erasing the data in the memory cells and the erase verification operation for the first target cell until the erase verification operation is passed, and thereafter repeatedly executes the erase verification operation for the second target cell along with the erase operation until the erase verification operation is passed.

13. The nonvolatile semiconductor storage device according to claim 8, wherein the memory string includes the first memory cell, the second memory cell, and a third memory cell being the other memory cell, a voltage applied to the selection wire connected to the third memory cell is defined as a third selection wire voltage, and the drive circuit controls the voltages so that the third selection wire voltage is the same as the second wire selection voltage in the erase verification operation.

14. A nonvolatile semiconductor storage device comprising:

a cell array including a cell unit, a selection wire and a gate wire, the cell unit including a memory string in which a plurality of memory cells for storing data are connected in series and a selection gate transistor being provided at one end of the memory string, the selection wire connecting to each of the memory cells, and the gate wire connecting to the selection gate transistor; and a drive circuit applying voltages to the selection wire and the gate wire during erase verification operation for confirming erasing of data in the memory cells, the memory cell adjacent to the selection gate transistor being defined as a first memory cell, the memory cell adjacent to the first memory cell being defined as a second memory cell, the memory cell adjacent to the first memory cell being defined as a second memory cell, a voltage applied to the gate wire being defined as a gate wire voltage, a voltage applied to the selection wire connected to the first memory cell being defined as a first selection wire voltage, and a voltage applied to the selection wire connected to the second memory cell being defined as a second selection wire voltage, and when the second selection wire voltage is lower than the gate wire voltage in the erase verification operation, the drive circuit controlling the voltages so that a difference between the gate wire voltage and the second selection wire voltage is less than a difference between the gate wire voltage and the first selection wire voltage.

15. The nonvolatile semiconductor storage device according to claim 14, wherein the memory cells of the memory string that are connected to odd-numbered points or even-numbered points are adopted as targets of the erase verification operation.

16. The nonvolatile semiconductor storage device according to claim 14, wherein a memory cell of the memory string connected at one of an odd-numbered point and an even-numbered point is defined as a first target cell, and a memory cell of the memory string connected at the other of the odd-numbered point and the even-numbered point is defined as a second target cell, and the drive circuit repeatedly executes the erase operation for erasing the data in the memory cells and the erase verification operation for the first target cell until the erase verification operation is passed, and thereafter repeatedly executes the erase verification operation for the second target cell along with the erase operation until the erase verification operation is passed.

17. The nonvolatile semiconductor storage device according to claim 14, wherein the memory string includes the first memory cell, the second memory cell, and a third memory cell is the other memory cell, a voltage applied to the selection wire connected to the third memory cell is defined as a third selection wire voltage, and the drive circuit makes the third selection wire voltage the same as the second wire selection voltage in the erase verification operation.

18. The nonvolatile semiconductor storage device according to claim 1, wherein each of the memory cells is configured to have a threshold voltage indicative of stored data, and the drive circuit causes the first dummy cell to attain a threshold voltage close to the threshold voltage corresponding to an erased state of the memory cell during the erase operation.

* * * * *